(12) United States Patent
Huang et al.

(10) Patent No.: US 9,543,980 B2
(45) Date of Patent: Jan. 10, 2017

(54) SYSTEMS AND METHODS FOR MODEL-FREE COMPRESSION AND MODEL-BASED DECOMPRESSION

(71) Applicant: Massachusetts Institute of Technology, Cambridge, MA (US)

(72) Inventors: Ying-Zong Huang, Seattle, WA (US); Gregory W. Wornell, Wellesley, MA (US)

(73) Assignee: Massachusettes Institute of Technology, Cambridge, MA (US)

( * ) Notice: Subject to any disclaimer, the term of this patent is extended or adjusted under 35 U.S.C. 154(b) by 0 days.

(21) Appl. No.: 14/616,248

(22) Filed: Feb. 6, 2015

(65) Prior Publication Data
US 2016/0204795 A1    Jul. 14, 2016

Related U.S. Application Data

(60) Provisional application No. 62/062,645, filed on Oct. 10, 2014.

(51) Int. Cl.
*H03M 7/30*    (2006.01)
*H03M 13/00*    (2006.01)

(52) U.S. Cl.
CPC .......... *H03M 7/30* (2013.01); *H03M 13/6312* (2013.01)

(58) Field of Classification Search
CPC ...... H03M 7/40; H03M 7/30; H03M 13/6312; G06T 9/00; G06T 9/001; G06T 9/004; H04L 67/327; H04N 19/60; H04N 19/1742; H04N 19/13; H04N 19/132; H04N 19/184
USPC ..... 341/55–90; 709/236, 238; 382/233, 239, 382/243, 238
See application file for complete search history.

(56) References Cited

U.S. PATENT DOCUMENTS

| | | | |
|---|---|---|---|
| 3,914,586 A | 10/1975 | McIntosh |
| 3,976,844 A | 8/1976 | Betz |
| 4,021,782 A | 5/1977 | Hoerning |
| 4,054,951 A | 10/1977 | Jackson et al. |
| 4,087,788 A | 5/1978 | Johannesson |
| 4,286,256 A | 8/1981 | Langdon, Jr. et al. |
| 4,295,125 A | 10/1981 | Langdon, Jr. |
| 4,366,551 A | 12/1982 | Holtz |
| 4,412,306 A | 10/1983 | Moll |
| 4,463,342 A | 7/1984 | Langdon, Jr. et al. |
| 4,464,650 A | 8/1984 | Eastman et al. |
| 4,467,317 A | 8/1984 | Langdon, Jr. et al. |

(Continued)

FOREIGN PATENT DOCUMENTS

JP    2-46275 A    11/1991

OTHER PUBLICATIONS

Aaron A et al., 'Towards Practical Wyner-Ziv Coding of Video,' 2003 International Conference on Image Processing—ICIP 2003, Barcelona, Spain, Sep. 14-17, 2003 (Sep. 14-17, 2003), IEEE Computer Society, Los Alamitos, CA (Pub), 2:iii-869-72.

(Continued)

*Primary Examiner* — Lam T Mai
(74) *Attorney, Agent, or Firm* — Goodwin Procter LLP

(57) ABSTRACT

An encoder generates a compressed data sequence from an original data sequence using many-to-one mapping independently of a source model associated with the original data sequence and without extracting the source model. A decoder uses both the source model associated with the original data sequence and the mapping applied during compression that is devoid of, in substance, the source model, to regenerate, at least in part, the original uncompressed data sequence from the compressed data sequence that does not include a significant portion of the source model.

27 Claims, 9 Drawing Sheets

(56) References Cited

U.S. PATENT DOCUMENTS

| | | | |
|---|---|---|---|
| 4,491,934 A | 1/1985 | Heinz | |
| 4,494,108 A | 1/1985 | Langdon, Jr. et al. | |
| 4,558,302 A | 12/1985 | Welch | |
| 4,560,976 A | 12/1985 | Finn | |
| 4,586,027 A | 4/1986 | Tsukiyama et al. | |
| 4,597,057 A | 6/1986 | Snow | |
| 4,612,532 A | 9/1986 | Bacon et al. | |
| 4,622,545 A | 11/1986 | Atkinson | |
| 4,633,490 A | 12/1986 | Goertzel et al. | |
| 4,652,856 A | 3/1987 | Mohiuddin et al. | |
| 4,677,649 A | 6/1987 | Kunishi et al. | |
| 4,682,150 A | 7/1987 | Mathes et al. | |
| 4,701,745 A | 10/1987 | Waterworth | |
| 4,730,348 A | 3/1988 | MacCrisken | |
| 4,758,899 A | 7/1988 | Tsukiyama | |
| 4,809,350 A | 2/1989 | Shimoni et al. | |
| 4,814,746 A | 3/1989 | Miller et al. | |
| 4,841,092 A | 6/1989 | Smiley | |
| 4,853,696 A | 8/1989 | Mukherjee | |
| 4,872,009 A | 10/1989 | Tsukiyama et al. | |
| 4,876,541 A | 10/1989 | Storer | |
| 4,891,643 A | 1/1990 | Mitchell et al. | |
| 4,905,297 A | 2/1990 | Langdon, Jr. et al. | |
| 4,906,991 A | 3/1990 | Fiala et al. | |
| 4,935,882 A | 6/1990 | Pennebaker et al. | |
| 4,941,193 A | 7/1990 | Barnsley et al. | |
| 4,943,869 A | 7/1990 | Horikawa et al. | |
| 4,955,066 A | 9/1990 | Notenboom | |
| 4,973,961 A | 11/1990 | Chamzas et al. | |
| 4,988,998 A | 1/1991 | O'Brien | |
| 5,001,478 A | 3/1991 | Nagy | |
| 5,003,307 A | 3/1991 | Whiting et al. | |
| 5,016,009 A | 5/1991 | Whiting et al. | |
| 5,023,611 A | 6/1991 | Chamzas et al. | |
| 5,025,258 A | 6/1991 | Duttweiler | |
| 5,049,881 A | 9/1991 | Gibson et al. | |
| 5,051,745 A | 9/1991 | Katz | |
| 5,065,447 A | 11/1991 | Barnsley et al. | |
| 5,109,433 A | 4/1992 | Notenboom | |
| 5,126,739 A | 6/1992 | Whiting et al. | |
| 5,140,321 A | 8/1992 | Jung | |
| 5,155,484 A | 10/1992 | Chambers, IV | |
| 5,179,378 A | 1/1993 | Ranganathan et al. | |
| 5,229,768 A | 7/1993 | Thomas | |
| 5,307,062 A | 4/1994 | Ono et al. | |
| 5,347,600 A | 9/1994 | Barnsley et al. | |
| 5,384,867 A | 1/1995 | Barnsley et al. | |
| 5,404,140 A | 4/1995 | Ono et al. | |
| 5,416,856 A | 5/1995 | Jacobs et al. | |
| 5,430,812 A | 7/1995 | Barnsley et al. | |
| 6,638,318 B1* | 10/2003 | Piret | G06T 9/001 714/781 |
| 7,271,747 B2 | 9/2007 | Baraniuk et al. | |
| 7,414,549 B1 | 8/2008 | Yang et al. | |
| 7,519,070 B2 | 4/2009 | Van Lunteren | |
| 7,649,479 B2 | 1/2010 | Liu et al. | |
| 7,743,165 B2* | 6/2010 | Paparella | H04L 67/327 709/236 |
| 7,990,290 B1 | 8/2011 | Jagmohan et al. | |
| 8,015,218 B2 | 9/2011 | Thienot et al. | |
| 8,046,496 B1 | 10/2011 | Nucci et al. | |
| 8,230,217 B2 | 7/2012 | He et al. | |
| 8,363,747 B2 | 1/2013 | Liu et al. | |
| 2008/0201718 A1 | 8/2008 | Zohar | |
| 2010/0223237 A1 | 9/2010 | Mishra et al. | |

OTHER PUBLICATIONS

Abbeel P et al., 'Learning Factor Graphs in Polynomial Time and Sample Complexity,' J Mach Learn Res, Aug. 2006 (Aug. 2006), 7:1743-88.

Ali K and Labeau F, 'Joint-Source-Channel Turbo Decoding of Entropy Coded Sources,' 2005 IEEE 62ND Vehicular Technology Conference, Dallas, Texas, Sep. 25-28, 2005 (Sep. 25-28, 2005), IEEE, Piscataway, NJ (Pub), 3:1960-4.

Bae JH and Anastasopoulos A, 'Capacity-Achieving Codes for Channels with Memory with Maximum-Likelihood Decoding,' IEEE J Select Areas Commun, 27(6):974-84.

Bell T et al., 'Modeling for Text Compression,' ACM Comput Surv, Dec. 1989 (Dec. 1989), 21(4):557-91.

Boufounos PT and Rane S, 'Efficient Coding of Signal Distances Using Universal Quantized Embeddings,' 2013 Data Compression Conference, Snowbird, Utah, Mar. 20-22, 2013 (Mar. 20-22, 2013), *Proc Data Compression Conf DCC'13*, A Bilgin et al., (Eds), IEEE Computer Society, Los Alamitos, CA (Pub), 1(2013):251-60.

Bursalioglu OY et al., 'Lossy Joint Source-Channel Coding Using Raptor Codes,' Int J Digit Multimed Broadcast, Jan. 1989 (Jan. 1989), 37(1):1-18.

Burshtein D and Miller G, 'An Efficient Maximum Likelihood Decoding of LDPC Codes Over the Binary Erasure Channel,' IEEE T Inform Theory, Nov. 2004 (Nov. 2004), 50(11):1-8.

Caire G et al., 'Almost-Noiseless Joint Source-Channel Coding-Decoding of Sources with Memory,' Proc 5TH Int ITG Conf "Source and Channel Coding", Munich, Germany, Jan. 2004 (Jan. 2004), ITG Fachbericht, Germany (Pub), 1(2004):295-304.

Caire G et al., 'Noiseless Data Compression with Low-Density Parity-Check Codes,' *Advances in Network Information Theory, DIMACS Series in Discrete Mathematics and Theoretical Computer Science*, (2004), P Gupta, G Kramer and AJ van Wijnggaarden (Eds), American Mathematical Society, Providence, RI (Pub), 66:263-84.

Cappellari L, 'Lossy Source Compression of Non-Uniform Binary Sources Using GQ-LDGM Codes,' 2010 IEEE Information Theory Workshop (ITW), Dublin, Ireland, Aug. 30-Sep. 3, 2010 (Aug. 30-Sep. 3, 2010), IEEE Computer Society, Los Alamitos, CA (Pub), 1(2010):1-5.

Carbonara MR et al., 'Compression of Digital Video Data Using Artificial Neural Network, Differential Vector Quantization,' *Applications of Artificial Neural Networks III*, (1ST Ed, 1992), SK Rogers (Ed), Proc SPIE 1709:422-33.

Chandar V et al., 'A Simple Message-Passing Algorithm for Compressed Sensing,' 2010 IEEE International Symposium on Information Theory (ISIT 2010), Austin, Texas, Jun. 13-18, 2010 (Jun. 13-18, 2010), IEEE Computer Society, Los Alamitos, CA, 1(2010):1968-72.

Chang NB, 'Rate Adaptive Non-Binary LDPC Codes with Low Encoding Complexity,' 2011 Conference Record of the 45TH Asilomar Conference on Signals, Systems and Computers (ASILOMAR), Pacific Cove, CA, Nov. 6-9, 2011 (Nov. 6-9, 2011), 1(2011):664-8.

Chou PA et al., 'Entropy-Constrained Vector Quantization,' IEEE T Acoust Speech, Jan. 1989 (Jan. 1989), 37(1):31-42.

Cleary JG and Witten IH, 'Data Compression Using Adaptive Coding and Partial String Matching,' IEEE T Commun, Apr. 1984 (Apr. 1984), COM-32(4):396-402.

Colavolpe G, 'On LDPC Codes Over Channels with Memory,' IEEE T Wirel Commun, Jul. 2006 (Jul. 2006), 5(7):1757-66.

Cormack GV and Horspool RNS, 'Data Compression Using Dynamic Markov Modelling,' Comput J, 1987 (1987), 30(6):541-50.

Csiszár I, 'Linear Codes for Sources and Source Networks: Error Exponents, Universal Coding,' IEEE T Inform Theory, Jul. 1982 (Jul. 1982), IT-28(4):585-92.

D Koller and N Friedman, *Probabilistic Graphical Models: Principles and Techniques*, (1ST Ed, 2009), MIT University Press, Cambridge, MA (Pub) (1233 pages) ISBN: 978-0-262-01319-2 (Part 1).

D Koller and N Friedman, *Probabilistic Graphical Models: Principles and Techniques*, (1ST Ed, 2009), MIT University Press, Cambridge, MA (Pub) (1233 pages) ISBN: 978-0-262-01319-2 (Part 2).

D Koller and N Friedman, *Probabilistic Graphical Models: Principles and Techniques*, (1ST Ed, 2009), MIT University Press, Cambridge, MA (Pub) (1233 pages) ISBN: 978-0-262-01319-2 (Part 3).

(56) References Cited

OTHER PUBLICATIONS

D Koller and N Friedman, *Probabilistic Graphical Models: Principles and Techniques*, (1ST Ed, 2009), MIT University Press, Cambridge, MA (Pub) (1233 pages) ISBN: 978-0-262-01319-2 (Part 4).

D Salomon, *Data Compression: The Complete Reference*, (4TH Ed, 2007), Springer-Verlag,.London, United Kingdon (Pub), (1092 pages) ISBN: 978-1-846-28603-2.

Demay G et al., 'Optimality of LDGM-LDPC Compound Codes for Lossy Compression of Binary Erasure Source,' 2010 International Symposium on Information Theory and its Applications (ISITA), Taichung, Taiwan, Oct. 17-20, 2010 (Oct. 17-20, 2010), IEEE Computer Society, Los Alamitos, CA (Pub), 1(2010):589-94.

Deorowicz S, 'Universal Lossless Data Compression Algorithms,' Doctor of Philosophy Dissertation, Jun. 2003 (Jun. 2003), Silesian University of Technology, University of Gilwice, Gilwice, Poland (Pub), pp. i-206, https:www/sun.ael.polsl.pl/~sdeor/pub/deo03.pdf.

Donoho DL, 'Compressed Sensing,' IEEE T Inform Theory, Apr. 2006 (Apr. 2006), 52(4):1289-306.

Dupraz E et al., 'Practical Coding Scheme for Universal Source Coding with Side Information at the Decoder,' 2013 Data Compression Conference, Snowbird, Utah, Mar. 20-22, 2013 (Mar. 20-22, 2013), *Proc Data Compression Conf DCC*'13, A Bilgin et al., (Eds), IEEE Computer Society, Los Alamitos, CA (Pub), 1(2013):401-10.

Fowler JE et al., 'Differential Vector Quantization for Video Compression Using Artificial Neural Network Codebook Design,' SPANN Laboratory Technical Report TR-92-05, Sep. 1992 (Sep. 1992), Signal Processing and Artificial Neural Networks (SPANN) Laboratory, The Ohio State University, Columbus, OH (Pub) (6 pages).

Fresia M et al., 'Joint Source and Channel Coding—Proposing a Low-Density Parity-Check Code,' IEEE Signal Proc Mag, Nov. 2010 (Nov. 2010), 27(6):104-13.

Fränti P and Ageenko E, 'On the Use of Context Tree for Binary Image Compression,' 1999 Int Conf "Image Precessing" ICIP'99, Kobe, Japan, Oct. 24-28, 1999 (Oct. 24-28, 1999), IEEE Signal Processing Society, Piscataway, NJ (Pub), 1(1999):752-6.

Gallager RG, 'Low-Density Parity-Check Codes,' IEEE T Inform Theory, Jan. 1962 (Jan. 1962), 8(1):21-8.

Garcia-Frias J and Villasenor JD, 'Combining Hidden Markov Source Models and Parallel Concatenated Codes,' IEEE Commun Lett, Jul. 1997 (Jul. 1997), 1(4):111-3.

Garcia-Frias J and Villasenor JD, 'Joint Turbo Decoding and Estimation of Hidden Markov Sources,' IEEE J Sel Area Comm, Sep. 9, 2001 (Sep. 9, 2001), 19(9):1671-9.

Garcia-Frias J and Zhao Y, 'Compression of Correlated Binary Sources Using Turbo Codes,' IEEE Commun Lett, Oct. 2001 (Oct. 2001), 5(10):417-9.

Garcia-Muñoz R and Neuhoff DL, 'Strong Universal Source Coding Subject to a Rate-Distortion Constraint,' IEEE T Inform Theory, Mar. 1982 (Mar. 1982), IT-28(2):285-95.

Ghahramani Z, 'Graphical Models: Parameter Learning,' *Handbook of Brain Theory and Neural Networks*, (2ND Ed, 2002), MA Arbib (Ed), MIT Press, Cambridge, MA (Pub), 2:486-90 ISBN-13:978-0262011976.

Gupta A and Verdú S, 'Nonlinear Sparse-Graph Codes for Lossy Compression,' IEEE T Inform Theory, May 2009 (May 2009), 55(5):161-75.

Guyader A et al., 'Joint Source-Channel Turbo Decoding of Entropy Coded Sources,' IEEE J Select Areas Commun, Sep. 2001 (Sep. 2001), 19(9):1680-96.

He D-K et al., 'Wyner-Ziv Video Compression Using Rateless LDPC Codes,' *Visual Communications and Image Processing 2008* (1ST Ed, 2008), WA Pearlman et al., (Eds), SPIE 6822:(68221U-1)-(68221U-9).

He L and Carin L, 'Exploiting Structure in Wavelet-Based Bayesian Compressive Sensing,' IEEE T Signal Proc Mag., Sep. 2009 (Sep. 2009), 57(9):3488-97.

Hindelang T et al., 'Source-Controlled Channel Decoding: Estimation of Correlated Parameters,' Proc 3RD ITG Conf, "Source and Channel Coding", Munich, Germany, Jan. 2000 (Jan. 2000), FACHBERICHT (2000):251-8.

Howard PG et al., 'The Emerging JBIG2 Standard,' IEEE T Circ Syst Vid, Nov. 1998 (Nov. 1998), 8(7):838-48.

Hu R et al., 'A New Coding Scheme for the Noisy-Channel Slepian-Wolf Problem: Separate Design and Joint Decoding,' Proc IEEE Global Telecom Conference 2004, Globecom '04 IEEE, Dallas Texas, Nov. 29-Dec. 3, 2004 (Nov. 29-Dec. 3, 2004), IEEE Communications Society, New York, NY (Pub), 1:51-5.

Huang Y-Z and Wornell GW, 'A Class of Compression Systems with Model-Free Encoding,' Information Theory and Applications Workshop (ITA), San Diego, California, Feb. 9-14, 2014 (Feb. 9-14, 2014), IEEE, Piscataway, NJ (Pub), 1(2014):1-7.

Jalali S et al., 'A Universal Scheme for Wyner-Ziv Coding of Discrete Sources,' IEEE T Inform Theory, Apr. 2010 (Apr. 2010), 56(4):1737-50.

JL Massey, 'Joint Source and Channel Coding,' *Communication Systems and Random Process Theory*, (1st Ed, 1978), JK Skwirzynski (Ed), Sijthoff & Noordhoff International Publishers B. V., Alphen aan den Rijn, The Netherlands (Publ), pp. 279-293.

Johnson M et al., 'On Compressing Encrypted Data,' IEEE T Signal Proc Mag, Oct. 2004 (Oct. 2004), 52(10):2992-3006.

K Sayood, *Introduction to Data Compression, The Morgan Kaufmann Series in Multimedia Information and Systems*, ($3^{RD}$ Ed, 2012), Morgan Kaufmann, New York, NY (Pub) (768 pages) ISBN-10: 0-124-15796-3.

Kakhaki AM et al., 'Capacity Achieving Linear Codes with Random Binary Sparse Generating Matrices Generating Matrices Over the Binary Symmetric Channel,' 2012 IEEE International Symposium on Information Theory Proceedings, Cambridge, Massachusetts, Jul. 1-6, 2012 (Jul. 1-6, 2012), IEEE Computer Society, Los Alamitos, CA (Pub), 1(2012):621-5.

Kamilov US et al., 'Message-Passing De-Quantization with Applications to Compressed Sensing,' IEEE Signal Proc Mag, Dec. 2012 (Dec. 2012), 60(12):6270-81.

Koetter R et al., 'Turbo Equalization—An Interactive Equalization and Decoding Technique for Coded Data Transmission,' IEEE Signal Proc Mag, Jan. 2004 (Jan. 2004), 21(1):67-80.

Kudekar S and Kasai K, 'Threshold Saturation on Channels with Memory via Spatial Coupling,' 2011 IEEE International Symposium on Information Theory Proceedings, St. Petersburg, Russia, Jul. 31-Aug. 5, 2011 (Jul. 31-Aug. 5, 2011), IEEE Computer Society, Los Alamitos, CA, 1(2011):2562-6.

Langdon Jr, GG, 'An Introduction to Arithmetic Coding,' IBM J Res Develp, Mar. 1984 (Mar. 1984), 28(2):135-49.

Liveris AD et al., 'Compression of Binary Sources with Side Information Using Low-Density Parity-Check Codes,' Proc IEEE Global Telecom Conf 2002, Globecom '02 IEEE, Taipei, Taiwan, Nov. 17-21, 2002 (Nov. 17-21, 2002), IEEE, Piscataway, New Jersey (Pub), 1(2002):1300-4.

Martinian E and Wainwright MJ, 'Analysis of LDGM and Compound Codes for Lossy Compression and Binning,' 2006 Proceedings of IEEE Information Theory Application (ITA) Workshop, San Diego, California, Feb. 2006 (Feb. 2006), IEEE Computer Society, Los Alamitos, CA (Pub), 1(2006):229-33.

Matsuta T et al., 'Universal Slepian-Wolf Sequence Source Codes Using Low-Density Parity-Check Matrices,' 2010 IEEE International Symposium on Information Theory (ISIT 2010), Austin, Texas, Jun. 13-18, 2010 (Jun. 13-18, 2010), IEEE Computer Society, Los Alamitos, CA (Pub), 1(2010):186-90.

MJ Wainright and MI Jordan, 'Graphical Models, Exponential Families, and Variational Inference,' *Foundations and Trends® in Machine Learning*, (1ST Ed, 2008), M Jordan (Ed), Now Publishers, Inc., Delft, Netherlands (Pub), 1(1-2):3-305 ISN:1935-8237.

Noll P, 'MPEG Digital Audio Coding,' IEEE Signal Process Mag, Sep. 1997 (Sep. 1997), 14(5):59-81.

Ordentlich E et al., 'Universal Algorithms for Channel Decoding of Uncompressed Sources,' IEEE T Inform Theory, May 2008 (May 2008), 54(5):2243-62.

Painter T and Spanias A, 'Perceptual Coding of Digital Audio,' Proc IEEE, Apr. 2000 (Apr. 2000), 88(4):451-513.

(56) References Cited

OTHER PUBLICATIONS

Pfister HD et al., 'Capacity-Achieving Ensembles for the Binary Erasure Channel with Bounded Complexity,' IEEE T Inform Theory, Jul. 2005 (Jul. 2005), 51(7):2352-379.

Rane S et al., 'Quantized Embeddings: An Efficient and Universal Nearest Neighbor Method for Cloud-Based Image Retrieval,' Proc SPIE 8856, Applications of Digital Imaging Processing XXXVI, Sep. 26, 2013 (Sep. 26, 2013), AG Tescher (Ed), SPIE, Bellingham, WA(Pub), pp. 1-13.

Rebollo-Monedero D and Girod B, 'A Generalization of the Rate-Distortion Function for Wyner-Ziv Coding of Noisy Sources in the Quadratic-Gaussian Case,' Data Compression Conference, Snowbird, Utah, Mar. 29-31, 2005 (Mar. 29-31, 2005), *Proc DCC '05 Compression Conf.*, JA Storer and M Cohn (Eds), IEEE Computer Society, Los Alamitos, CA (Pub), 1(2005):23-32.

Reyes MG, 'Cutset Based Processing and Compression of Markov Random Fields,' Dissertation for the Degree of Doctor of Philosophy in Electrical Engineering: Systems, 2011 (2011), University of Michigan, Ann Arbor, Michigan, Deep Blue, Ann Arbor, MI (Pub), (210 pages) <https://www.deepblue.lib.umich.edu/documents> (THESIS).

Rissanen J and Langdon Jr GG, 'Universal Modeling and Coding,' IEEE Trans Inform Theory, Jan. 1981 (Jan. 1981), IT-27:12-23.

Rissanen J, 'A Universal Data Compression System,' IEEE T Inform Theory, Sep. 1983 (Sep. 1983), IT-29(5):656-64.

Said A, 'Chapter 5: Arithmetic Coding,' *Lossless Compression Handbook*, (1st Ed, 2003), K Sayood (Ed), Academic Press, San Diego, CA (Pub), pp. 101-150.

Sarvotham S et al., 'Compressed Sensing Reconstruction via Belief Propagation,' Tech Rep TREE0601, Jul. 2006 (Jul. 2006), Rice University, Houston, TX (Pub) 1:1-24.

Schonberg D et al., 'On Blind Compression of Encrypted Data Approaching the Source Entropy Rate,' 13TH Euro Signal Process Conf, Antalya, Turkey, Sep. 4-8, 2005 (Sep. 4-8, 2005), IEEE Signal Processing Society, Piscataway, NJ (Pub), 1(2005):1-4.

Schonberg D et al., 'On Compression of Encrypted Images,' IEEE Trans Signal Process, Oct. 2004 (Oct. 2004), 52(10):2992-3006.

Schonberg DH, 'Practical Distributed Source Coding and its Application to the Compression of Encrypted Data,' Dissertation for the Degree of Doctor of Philosophy in Engineering—Electrical Engineering and Computer Science, 2007 (2007), University of Michigan, Ann Arbor, Michigan, Deep Blue, Ann Arbor, MI (Pub), (210 pages) <https://www.deepblue.lib.umich.edu/documents>.

Shannon CE, 'A Mathematical Theory of Communication,' AT&T Tech J, Oct. 1948 (Oct. 1948), 27(3):379-423, 623-56.

Skodras A et al., 'The JPEG 2000 Still Image Compression Standard,' IEEE Signal Proc Mag, Sep. 2001 (Sep. 2001), 18(5):36-58.

Slepian D and Wolf JK, 'Noiseless Coding of Correlated Information Sources,' IEEE T Inform Theory, Jul. 1973 (Jul. 1973), IT-19(4):471-80.

Sun Z et al., 'Achieving the Rate-Distortion Bound with Low-Density Generator Matrix Codes,' IEEE T Commun, Jun. 2010 (Jun. 2010), 58(6):1643-53.

T Berger, *Rate Distortion Theory: Mathematical Basis for Data Compression, The Prentice-Hall Series on Information and System Sciences*, (1ST Ed, 1971), Prentice-Hall Publishing Co, Upper Saddle River, New Jersey (Pub), (311 pages) IBSN-10: 0-137-53103-6.

T Richardson and R Urbanke, *Modern Coding Theory*, (1ST Ed, 2008), Cambridge University Press, Cambridge, United Kingdom (Pub) (572 pages) ISBN: 978-0-521-85229.

Taghavi MH, 'Decoding Linear Codes via Optimization and Graph-Based Techniques,' Dissertation for the Degree of Doctor of Philosophy in Electrical Engineering, 2008 (2008) University of California, San Diego, San Diego, California, ProQuest Dissertations Publishing, Ann Arbor, MI (Pub) (168 pages) (THESIS).

Wainwright MJ and Maneva E, 'Lossy Source Encoding via Message-Passing and Decimation over Generalized Codewords of LDGM Codes,' Proc Int Symp "Information Theory", Adelaide, Australia, Sep. 2005 (Sep. 2005), pp. 1-5.

Wainwright MJ et al., 'Lossy Source Compression Using Low-Density Generator Matrix Codes: Analysis and Algorithms,' IEEE T Inform Theory, Mar. 2010 (Mar. 2010), 56(3):1351-68.

Willems FMJ et al., 'The Context-Tree Weighting Method: Basic Properties,' IEEE T Inform Theory, May 1995 (May 1995), 41(3):653-64.

Wyner AD and Ziv J, 'The Rate-Distortion Function for Source Coding with Side Information at the Decoder,' IEEE T Inform Theory, Jan. 1976 (Jan. 1976), IT-22(1):1-10.

Wyner AD, 'The Rate-Distortion Function for Source Coding with Side Information at the Decoder-II: General Sources,' Inform Control, Jul. 1978 (Jul. 1978), 38(1):60-80.

Xie S et al., 'Wyner-Ziv Image Coding from Random Projections,' Proc IEEE Int Conf "Multimedia and Expo" (ICME '07), Beijing, China, Jul. 2-5, 2007 (Jul. 2-5, 2007), IEEE, Piscataway, NJ (Pub), 1:136-9.

Zhao Y and Garcia-Frias J, 'Data Compression of Correlated Non-Binary Sources Using Punctured Turbo Codes,' Data Compression Conference, Salt Lake City, Utah, Apr. 2-4, 2002 (Apr. 2-4, 2002), *Proc DCC'02 Data Compression Conf*, IEEE Computer Society, Los Alamitos, CA (Publ), 1(2002):242-51.

Zhu G-C and Alajaji F, 'Joint Source-Channel Turbo Coding for Binary Markov Sources,' IEEE T Wirel Commun, May 2006 (May 2006), 5(5):1065-75.

Ziv J et al., 'A Universal Algorithm for Sequential Data Compression,' IEEE T Inform Theory, May 1977 (May 1977), IT-23(3):337-43.

Ziv J et al., 'Compression of Individual Sequences via Variable-Rate Coding,' IEEE T Inform Theory, Sep. 1978 (Sep. 1978), IT-24(5):530-6.

\* cited by examiner

| Notation | Meaning |
|---|---|
| $s$ | a scalar or vector variable |
| $s^n$ | a vector of length $n$ |
| $s_i$ | the i-th element of the vector $s$ or $s^n$ |
| $\mathcal{S}$ | an alphabet of symbols or vectors |
| $\mathscr{C}$ | a collection, class, or family of objects |
| $\mathcal{G} = (\mathcal{V}, \mathcal{E})$ | a graph having a set of nodes $\mathcal{V}$ and a set of edges $\mathcal{E}$ |
| $\mathcal{N}_i^{\mathcal{G}}$ | the open neighborhood of $v_i \in \mathcal{V}$ |
| $\mathcal{G}' = (\mathcal{V}1, \mathcal{V}2, \mathcal{E}')$ | a factor graph, where $\mathcal{V}1$ are source nodes, $\mathcal{V}2$ are factor nodes, and $\mathcal{E}'$ are edges. $\mathcal{G}'$ and $\mathcal{G}$ can be equivalent to each other |

FIG. 1

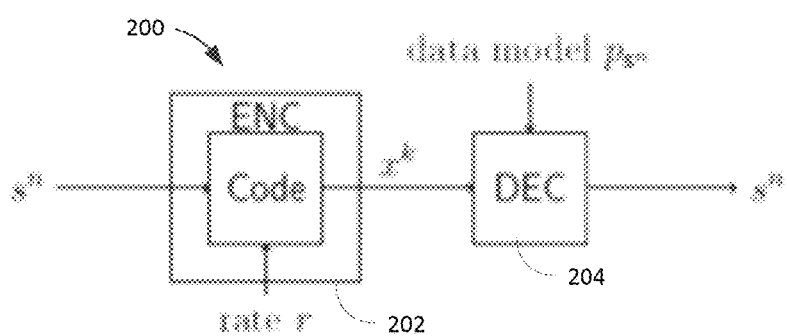

FIG. 2

$\mathcal{G}$ component $\mathcal{S}$ node output: $\quad \mu^{j \leftarrow i} \Leftarrow \psi_i^j \phi^i \mu^{i \leftarrow \sim j} [M^{i \leftarrow}]_\mathcal{G}$ $\mathcal{S}$ external message output: $\quad [M^{i \rightarrow}]_\mathcal{G} \Leftarrow \phi^i \mu^{i \leftarrow *}$ $\mathcal{C}$ component $\mathcal{S}$ node output: $\quad m^{j \rightarrow a} \Leftarrow m^{i \leftarrow \sim a} [M^{i \leftarrow}]_\mathcal{C}$ $\mathcal{X}$ node output: $\quad m^{i \leftarrow a} \Leftarrow f^i_{\sim i} m^{\sim i \rightarrow a}$ $\mathcal{S}$ external message output: $\quad [M^{i \rightarrow}]_\mathcal{C} \Leftarrow m^{i \leftarrow *}$ Controller Connectivity: $\quad [M^{i \leftarrow}]_\mathcal{G} = [M^{i \rightarrow \mathcal{G}}] \Leftarrow [M^{i \leftarrow \mathcal{C}}] = [M^{i \rightarrow}]_\mathcal{C}$ $[M^{i \leftarrow}]_\mathcal{C} = [M^{i \rightarrow \mathcal{C}}] \Leftarrow [M^{i \leftarrow \mathcal{G}}] = [M^{i \rightarrow}]_\mathcal{G}$ Total belief computation: $\quad b^i = [M^{i \leftarrow \mathcal{G}}][M^{i \leftarrow \mathcal{C}}] = [M^{i \rightarrow}]_\mathcal{G} [M^{i \rightarrow}]_\mathcal{C}$

FIG. 4

SYSTEMS AND METHODS FOR MODEL-FREE COMPRESSION AND MODEL-BASED DECOMPRESSION

CROSS-REFERENCE TO RELATED APPLICATIONS

This application claims priority to and the benefit of, and incorporates herein by reference in its entirety, U.S. Provisional Patent Application No. 62/062,645, entitled "Systems and Methods for Model-Free Compression and Model-Based Decompression," which was filed on Oct. 10, 2014.

STATEMENT REGARDING FEDERALLY SPONSORED RESEARCH OR DEVELOPMENT

This invention was made with Government support under Grant No. CCF-1017772 awarded by the National Science Foundation and under Grant No. FA9550-11-1-0183 awarded by the Air Force Office of Scientific Research. The Government has certain rights in the invention.

FIELD OF THE INVENTION

This disclosure generally relates to techniques for efficient storage and/or transmission of data and, in particular, to data compression.

BACKGROUND

Storage and transmission of data often incur significant costs. Compression can reduce these costs by allowing one to reproduce the same or nearly the same data using more succinct descriptions. A compression/decompression system typically includes an upstream encoder and a downstream decoder, the internal algorithm for both of which is generally carefully designed to maximize compression efficiency. To operate, the encoder and/or the decoder typically use knowledge about the special characteristics of the data.

In particular, the compression of data is predicated on the existence of certain predictable or typical statistical characteristics in data, which must be identified by an expert or inferred by an algorithm. This information is commonly called the "source model" because it models the statistical source from which the data is presumed to be drawn. The efficiency with which compression can be performed on data is described by Shannon's information theory on source coding, in which the predictability of various sources is characterized by the "entropy" of the source model. Entropy forms the ultimate lower bound on how much data can be compressed while remaining faithful in reproduction (or with some preset loss as measured by a metric). The source model is generally the key piece of information in known compression systems. Various systems have been designed to exploit the source model of the data either explicitly or implicitly.

In practical systems (e.g., image compression), a compression input is often deconstructed by the upstream encoder according to its assumption of a source model (e.g., a model for natural images), such as by transforming the data into a different domain (e.g., a frequency domain, for images) in which the data is in a "simpler" form for subsequent coding. Such a process often becomes the basis of a compression standard for the type of data in question, defining the parameters within which the encoder operates, the format of the compressed output from the encoder, and the decoder that must parse this output to reconstitute the data in the reverse process. Once widely deployed and legacy compressed data is generated, the process of encoding becomes ossified to a large extent, even as newer understandings about the source model or better coding methods may evolve. This is one reason for the lack of uptake for JPEG2000, a technologically superior successor to JPEG image compression.

Typically, noise is introduced in the information/data sequence (also called data message) when it is transmitted through a medium, e.g., air. The noise can cause symbols (e.g., bits) of the data sequence to change, resulting in the reception of a data sequence that may contain erroneous symbols. Error correction codes can address this problem. In general, error correction codes introduce redundancy, e.g., parity bits, prior to the transmission of a data sequence. To this end, during encoding, some error correction codes employ a so called "generator" matrix. In some systems, a joint source-channel coding model is employed, where the channel coding may provide for error correction by introducing and/or exploiting redundancy in a sequence of data to be transmitted. The joint model is limited to only a few kinds of source models.

When the data sequence is received, one or more of the informational symbols (e.g., data bits) and one or more of the redundant symbols (e.g., parity bits) that were added during encoding can be erroneous. By analyzing the entire received data sequence, any errors in one or more of the informational symbols can be detected and may even be corrected. To this end, during decoding, some error correction codes employ a so called "parity matrix," which is related to the generator matrix. If there are no errors in the received data sequence, applying the parity matrix to the received data sequence yields a zero scalar or vector value, indicating that there were no errors in the received data sequence.

The error correction codes typically add new symbols to the data sequence to be transmitted and/or stored and, thus, generally perform in a manner opposite to that of compression/decompression systems. Specifically, instead of decreasing the number of symbols to be transmitted and/or stored, error correction codes generally increase the total number of symbols to be transmitted and/or stored.

As described above, the encoders in the known compression/decompression systems typically use knowledge about the special characteristics of the data. However, wherever specialized knowledge is used in the system, the downstream system is generally dependent on the particular choice, which usually reduces flexibility in system design and network transport, and may prevent future improvements without a significant overhaul of the entire system and losing compatibility with already compressed data.

SUMMARY

Various embodiments of systems and methods described herein feature a new technology to compress data in a different way. The technology defers nearly all assumed knowledge about the data until the downstream decoder, without losing compression efficiency in a significant manner. Several embodiments can compress and decompress a few types of data, and the architectural design principles that can be applied to compress any type of data, so long as the specialized knowledge is supplied or can be inferred at the decoder, are described as well. This adaptability is valuable for tackling the storage and communication of a rapidly growing stock of raw data in "big data" fields such as bioscience and finance, as well as for potentially upgrading the compression of traditional data such as video, audio, images, natural language text and databases, etc.

The technology described herein, called "compression with model-free encoding," is based on the surprising discovery that the source model, a key piece of information for any compression system, does not need to be known at the upstream encoder at all for efficient compression to take place. This recognition is counterintuitive and offers a substantially different way of performing compression than many known methods. Our technology therefore entails new algorithms for encoders, decoders, and other system components, which may have application beyond data compression.

In various embodiments, "compression with model-free encoding" is performed by "blindly" decimating the original data in the upstream encoder to an agreed upon rate. The output of this process is a set of succinct but potentially non-unique specifications on the data: this is the compressed data stream. In the downstream decoder, these specifications are combined with the statistical characteristics of the data type, i.e. the source model, to recover a solution that agrees with (or is close to, depending on the application) the original data.

One key problem this technology solves is how to incorporate the source model into the decoder, where it traditionally does not reside. In various embodiments of decoders described herein, several modular components—one or more in one set representing statistical characteristics of the general data type, one or more in another set representing the succinct specifications of the particular piece of data— exchange information leading to a generally unequivocal solution that has both the statistical characteristics of the data type and satisfies the specifications of the particular data. In one particular embodiment, this is achieved by using joint inference on graphical models. Graphical models is a method used with some prevalence in modern machine learning to describe structure in data, as well as the basis for decoding a class of modern error correction codes with superb performance in network communication.

One novel aspect of the embodiment, at least in part, is to combine a source model and the constraints associated with a rate k/n encoding, in the language of graphical models and to use iterative inference algorithms on graphs to solve the data compression decoding problem with practical computational complexity. In general, for a sequence of n symbols, k greater than n represents an error-correcting code while k less than n represents compression of the sequence of n symbols. For error correction, the constraints can be expressed as a parity-check matrix and for compression they can be represented as a projection matrix. The combination of the source model and the constraints during decoding allows the encoding in various embodiments to be a relatively non-complex operation. In general, encoders according to various embodiments do not need to acquire specific knowledge of the source model upstream.

As used herein, combining the source model and the constraints does not mean forming a joint model. Combining means only that the constraints and a source model are both used in the decoding process. Unlike certain joint models, which incorporate channel coding that can increase the number of symbols in a processed data sequence, the constraints represent a compression model (also called a code model) that reduces the number of symbols in the processed data sequence. Moreover, the source model and the code model are not merged or integrated to form a joint model. As such, the respective computations associated with each model are performed separately. This allows the decoder to operate in a modular manner. For example, the same encoder may be employed to compress data sequences generated from difference sources, having different source models. Recall, that the encoder does not depend, at least in substance, on any source or model thereof. Two different decoders can be readily provided—both using the same code model, but one using a source model corresponding to one source and the other one using a source model corresponding to the other source. Similarly, different coding (i.e., compression) models can also be readily employed in the encoder and decoder, taking advantage of the fact that the decoder uses both the source and code models, but performs the respective computations separately.

Accordingly, in one aspect, a computer implemented method of decompressing a compressed data sequence having a set of k symbols is provided. The set of k symbols of the compressed data sequence is devoid of a significant portion of a source model associated with a data sequence from which the compressed data sequence was derived. The method includes generating by a processor an uncompressed data sequence that includes n symbols, where n is greater than k, by applying by the processor to the set of k symbols one or more constraints that are devoid of a significant portion of the source model. One or more rules derived from the source model may also be applied to the set of k symbols. The compressed data sequence may have been derived from the uncompressed data sequence or a substantially similar data sequence by applying the one or more constraints to the uncompressed data sequence or the substantially similar data sequence.

In some embodiments, the compressed data sequence is completely devoid of the source model, and the several constraints are also completely devoid of the source model. The one or more constraints may include a projection matrix corresponding to a low density parity check (LDPC) code. In general, the constraints may represent linear codes, including LDPC codes, codes on graphs such as LDPC codes, turbo codes, repeat-accumulate codes, convolutional codes, and trellis codes, and polar codes. Each of the several constraints may be independent of any rule derived from the source model. In some embodiments, the uncompressed data sequence includes an encrypted data sequence, where the derivation of the compressed data sequence was performed without using any information about any encryption key used in generating the encrypted data sequence. The processor uses an encryption key used in generating the encrypted data sequence for generating the uncompressed data sequence.

In some embodiments, generating the uncompressed data sequence includes: (a) applying by the processor to one or more of the k symbols one or more constraints from the number of constraints, to obtain one or more intermediate results. In these embodiments, the method also includes: (b) applying by the processor one or more rules to one or more intermediate results. Either step (a) or step (b) or both may be repeated once or several times. The overall iterations may include one or more iterations of step (a) followed by one or more iterations of step (b), vice versa, or steps (a) and (b) may be performed alternatingly, either step (a) following step (b) or vice versa, i.e., in one iteration, step (b) may be performed before step (a).

In some embodiments, generating the uncompressed data sequence comprises: (i) applying by the processor to one or more of the k symbols one or more rules, to obtain one or more intermediate results. In these embodiments, generating the uncompressed data sequence also includes: (ii) applying by the processor one or more constraints from the various constraints to one or more intermediate results. Either step (i) or step (ii) or both may be repeated once or several times. The overall iterations may include one or more iterations of step (i) followed by one or more iterations of step (ii), vice versa, or steps (i) and (ii) may be performed alternatingly, either step (i) following step (ii) or vice versa, i.e., in one iteration, step (ii) may be performed before step (i).

In some embodiments, the source model is partially unknown and is parameterized. As such, generating the uncompressed data sequence may include iteratively applying one or more of the several constraints and one or more rules, and iteratively refining one or more parameters of the source model, thereby refining the source model. Alternatively, or in addition, in some embodiments the source model is represented as a graph, and the method includes augmenting the graph using one or more parameters of the source model. Generating the uncompressed data sequence may include representing the n symbols of the uncompressed data sequence, which may derived from a non-binary alphabet, in a binary form. The source model may be represented as a graph, a codebook, an enumeration, a list of examples, a list of features, an algorithm, a data structure, or as a combination of two or more of these representations. In some embodiments, the method may include applying by the processor to the set of k symbols of the compressed data sequence, another set of constraints representing a quantization of the set of n symbols according to a distortion measure, semantic information, or both.

In another aspect, a computer implemented method of compressing a data sequence having a set of n symbols includes mapping by a processor the set of n symbols into a set of k symbols, where k is less than n. The mapping is performed independently of a source model corresponding to the data sequence, and is performed without extracting the source model from the data sequence. The mapping may include applying to the data sequence one or more of a projection matrix corresponding to a low density parity check (LDPC) code; a linear code; a code on a graph comprising at least one of an LDPC code, a turbo code, a repeat-accumulate code, a convolutional code, and a trellis code; and a polar code. The set of k symbols may be devoid of a significant portion of the source model.

In some embodiments, the data sequence includes or is an encrypted data sequence, and the mapping is performed without any information about any encryption key used in generating the encrypted data sequence. In some embodiments, the method includes quantizing the set of n symbols according to a distortion measure, semantic information, or both, prior to the mapping. The source model may be represented as a graph, a codebook, an enumeration, a list of examples, a list of features, an algorithm, a data structure, or as a combination of two or more of these representations.

In another aspect, a system for decompressing a compressed data sequence includes a first processor and a first memory in electrical communication with the first processor. The compressed data sequence has a set of k symbols devoid of a significant portion of a source model associated with a data sequence from which the compressed data sequence was derived. The first memory includes instructions which, when executed by a processing unit that may include the first processor and/or a second processor, program the processing unit to generate, from the compressed data sequence, an uncompressed data sequence having n symbols, where n is greater than k. The instructions program the processor to apply to the set of k symbols of the compressed data sequence one or more constraints devoid of a significant portion of the source model and one or more rules derived from the source model.

The generation of the uncompressed data sequence may include an accumulation operation, a filtration operation, or both. The processing unit may be configured to provide atomically the accumulation operation and/or the filtration operation. In some embodiments, the compressed data sequence is completely devoid of the source model, and the several constraints are also completely devoid of the source model.

In another aspect, a system for compressing a data sequence having a set of n symbols includes a first processor and a first memory in electrical communication with the first processor. The first memory includes instructions which, when executed by a processing unit that may include the first processor and/or a second processor, program the processing unit to map the set of n symbols of the uncompressed data sequence into a set of k symbols of a compressed data sequence, where k is less than n. The instructions program the processor to perform the mapping independently of a source model corresponding to the data sequence, and without extracting the source model from the data sequence.

In yet another aspect, a processor includes an atomic accumulator, configured to execute atomically an accumulation operation associated with belief propagation. Alternatively, or in addition, the processor may include an atomic filter, configured to execute atomically a filtration operation associated with the belief propagation. The belief propagation may be performed on a source-code graph.

These and other objects, along with advantages and features of the embodiments disclosed herein, will become more apparent through reference to the following description, the accompanying drawings, and the claims. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 1 shows a table listing various notations used throughout this disclosure;

FIG. 2 schematically depicts an encoder-decoder system, according to one embodiment;

FIG. 4 shows a table listing various computations performed by the decoder depicted in FIG. 3C;

DETAILED DESCRIPTION

The table depicted in FIG. 1 describes the notation used generally in this disclosure. With reference to FIG. 2, an encoder-decoder system 200 includes a model-free encoder 202 that can compress an input data sequence $s^n$ and output a compressed data sequence $x^k$. The encoder 202 can be implemented by one or more hardware processors and/or as one or more software components. The encoder 202 does not receive in substance a source model for the data sequence $s^n$, and does not derive a substantial portion, if any, of such a model during the process of encoding (as typical universal encoders do). As a consequence, the compressed data sequence $x^k$ does not include a substantial portion of the source model. As used herein, substantial portion generally means information that can identify the class of possible data, highly likely data, or data of compression interest, e.g., an exponentially smaller set of symbol sequences than the set of all possible n symbol sequences.

The compressed data sequence $x^k$ is typically transmitted wirelessly, via a cable (electrically conductive and/or optical), and/or using a non-transitory medium such as flash memory, compact disc, hard drive, solid-state drive, etc., to a decoder 204. The decoder 204 can be implemented by one or more hardware processors and/or as one or more software components. The decoder 204 receives a source model (also called data model) $p_{s^n}$ and generates the original input sequence $s_n$. A source model can be represented as a graph, a codebook, an enumeration, a list of examples, a list of features, an algorithm, or a data structure, or as a combination of two or more of these representations.

In one embodiment, all data objects, compressed and uncompressed, are based on a finite-field alphabet S=GF(q). Let $s^n \in S^n$ be an n-vector source data sequence presumed to be a random sample of $s^n$. Such a sequence can be compressed using a code: a collection $\mathcal{H}$ (n, k) of k×n projection matrices of a rate k/n linear source code ensemble, where k<n. Examples of such ensembles include but are not limited to low density parity check code (LDPC) ensemble. The decompression (also called decoding) requires a data model: $p_{s^n}$ in some factored form or in a probabilistic graphical model (PGM) representation. In some embodiments, the PGM is a pairwise model.

Figure 8:
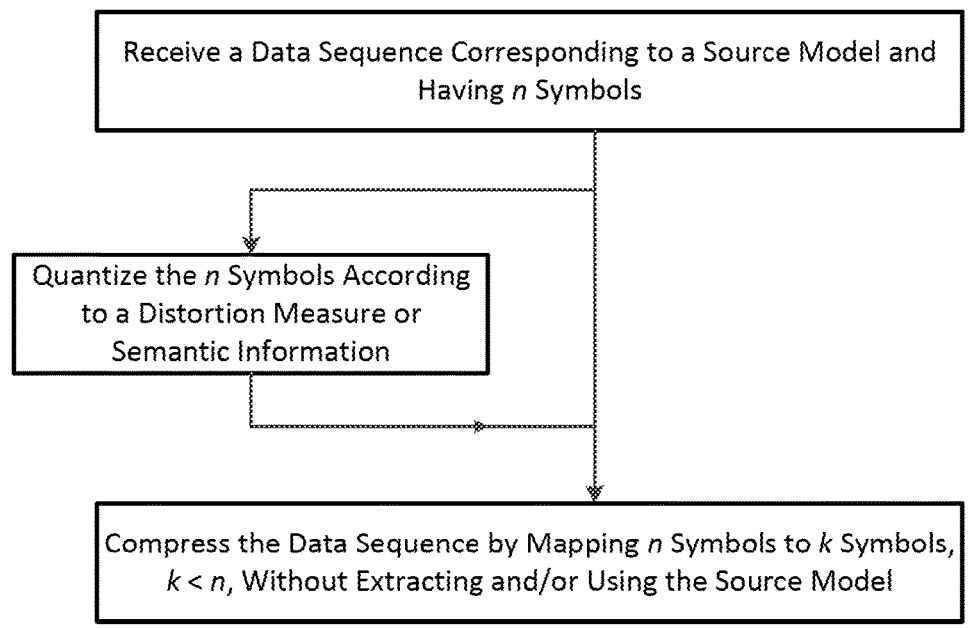
FIG. 8 is a flow chart depicting compression of an uncompressed data sequence, according to some embodiments.

With reference to FIG. 8, to encode, i.e., compress data, k is set to target $r_{code}$=k/n as the nominal compression rate. If LDPC codes are used for compression, a projection matrix H is selected from the collection $\mathcal{H}$ (n, k) as the encoding matrix. For an input data sequence $s^n$ of length n, a bin label sequence $x^k$ of length k, where k<n is produced by the encoder 202, as $x^k$=H$s^n$. The sequence $x^k$ is the compressed output data. In some embodiments, the encoder may produce additional outputs such as values of doped symbols, doping locations, and/or a random seed used to select H from the collection $\mathcal{H}$ (n, k). Instead of applying a projection matrix, encoding, i.e., deriving k symbols from a sequence of n symbols, may be performed using binning, hashing, and/or decimation.

Figure 7:
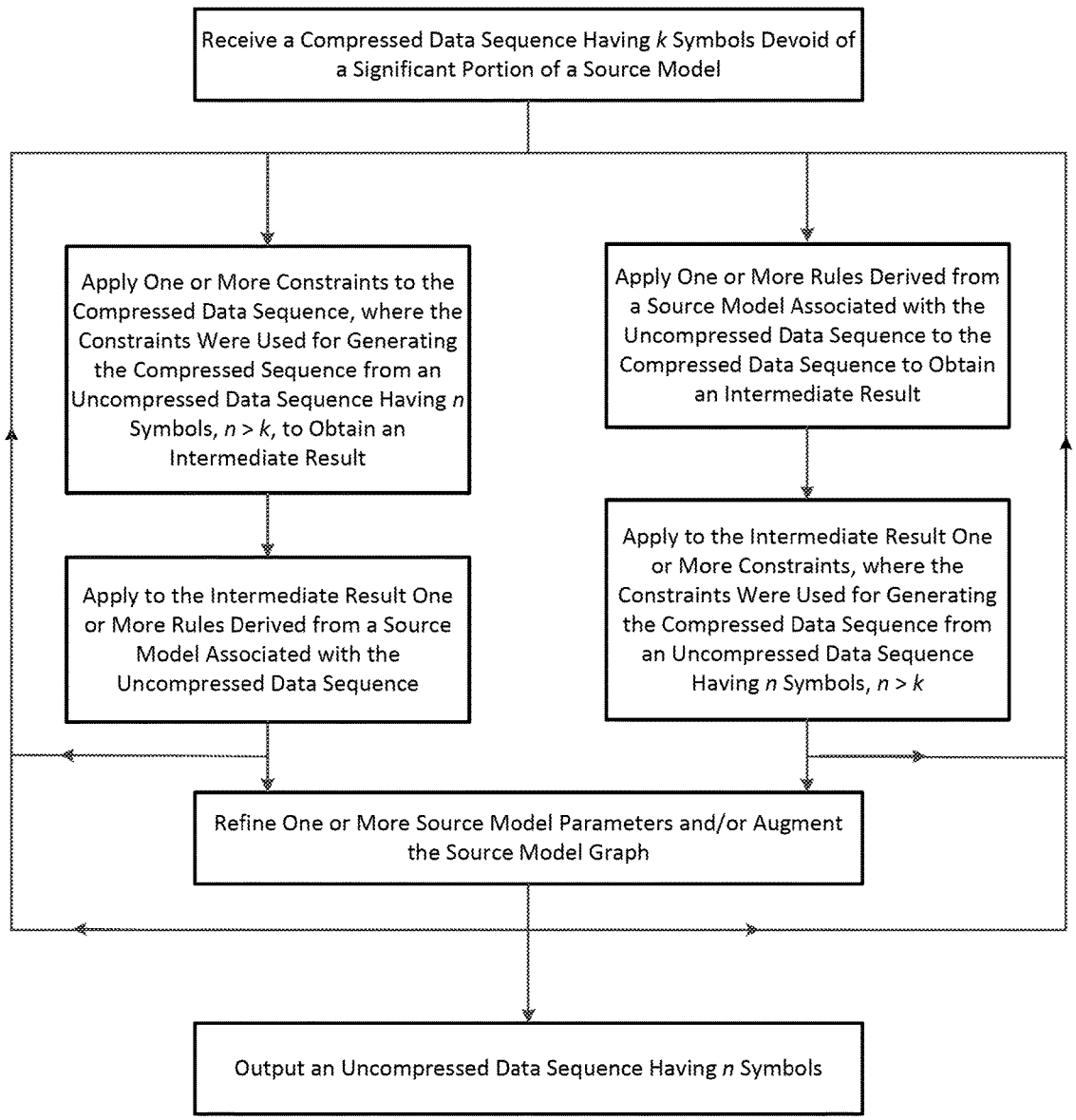
FIG. 7 is a flow chart depicting decompression of a compressed data sequence, according to some embodiments.

With reference to FIG. 7, when the compressed data $x^k$ is received at a receiver, it may be decoded by decoder 204. To this end, the decoder 204 utilizes a code subgraph. Because H enforces k hard constraints of the form $x_a = \sum_{i=1}^n H_{a,i} s_i$, the constraints can be represented as a bipartite factor graph $c = (S, X, F)$, where there are k factor nodes $X \triangleq \{f_1, \ldots, f_k\}$ and n source nodes $S \triangleq \{s_1, \ldots, s_n\}$. There is an edge between factor node $f_a$ and source node $s_i$ if and only if $H_{a,i} \neq 0$, forming neighborhoods denoted by $A = \mathcal{N}_a^c c$. The algorithmic meaning of C is observed from the hash constraint function:

$$c(s^n) \triangleq \prod_{a=1}^k f_a(s_A) = \prod_{a=1}^k \mathbb{1}\left\{x_a = \sum_{i: H_{a,i} \neq 0} H_{a,i} s_i\right\}(s_A)$$

where each factor is an indicator on one hard constraint, and $c(s^n)$=1 if and only if all constraints are satisfied. $c(s^n)$ is an (unnormalized) probability distribution and various PGM algorithms can be applied thereto. In various embodiments, iterative local decoding of the linear source code with H is substantially the same as approximate marginalization of $c(s^n)$ on C, which is called the code subgraph. In general, the constraints may represent linear codes, including LDPC codes, codes on graphs such as LDPC codes, turbo codes, repeat-accumulate codes, convolutional codes, and trellis codes, and polar codes.

The decoder 204 also utilizes a source subgraph. If the data model $p_{s^n}$ is in a factored form, a factor graph can be formed directly therefrom. If the data model $p_{s^n}$ is a directed or undirected PGM, it can be converted into a factor graph form using belief propagation marginalization. Without the loss of generality, in some embodiments, $s^n \sim p_{s^n}$. $s^n \sim p_{s^n}$ is represented by an undirected graph $\mathcal{G} = (S, \epsilon)$ over the n source nodes $S \triangleq \{s_1, \ldots, s_n\}$, in the sense that $p_{s^n}$ is factored over the maximal cliques of $\mathcal{G}$ as:

$$p_{s^n}(s^n) = \frac{1}{Z} \prod_{C \in cl(\mathcal{G})} \psi_C(s_C)$$

This factored form can be expressed as a factor graph $\mathcal{G}' = (S, \Psi, \epsilon')$. In some embodiments, if $\mathcal{G}$ is a pairwise model, no conversion is needed, and the computation can be performed directly on $\mathcal{G}$. Either one of $\mathcal{G}$ and $\mathcal{G}'$ may be called a source subgraph.

Figure 3A:
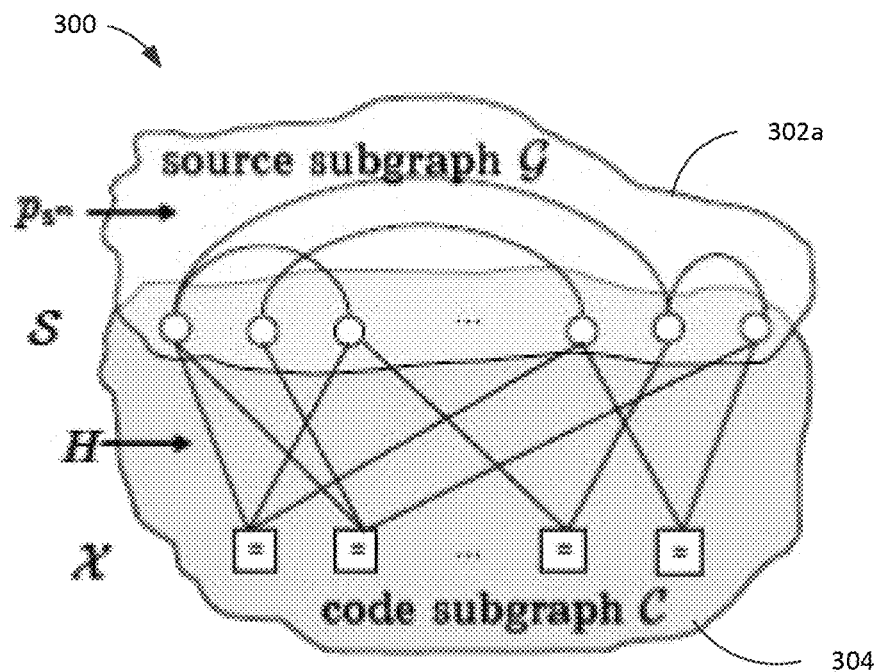
FIG. 3A schematically depicts a decoder, according to one embodiment.
Figure 3B:
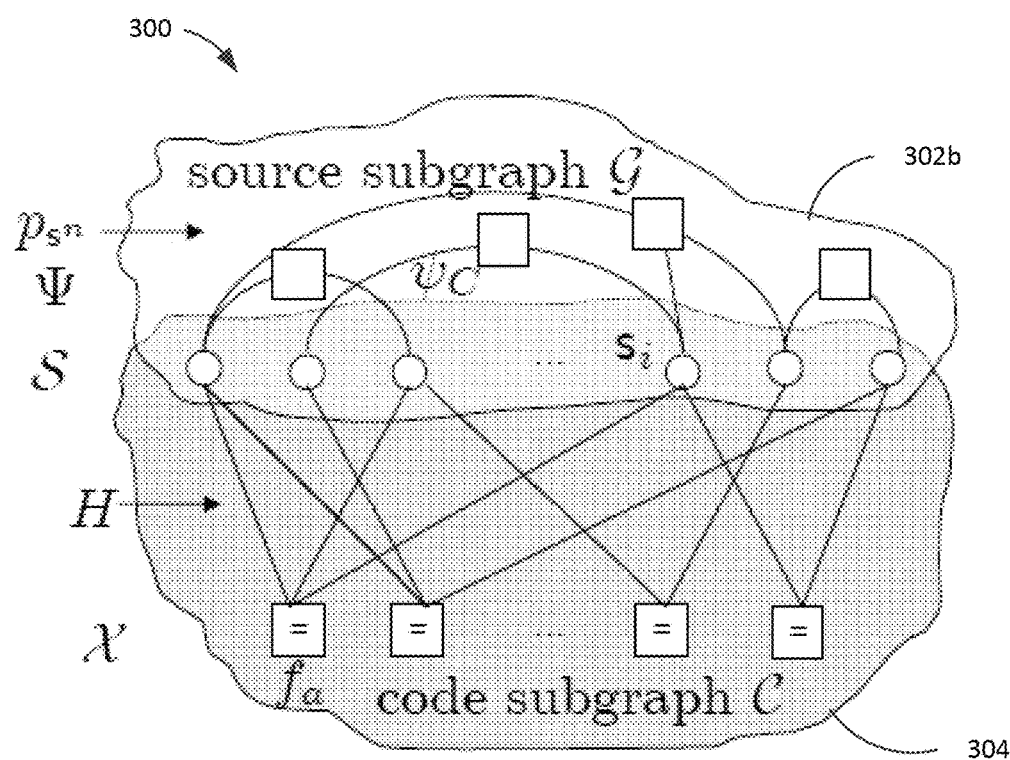
FIG. 3B schematically depicts the decoder depicted in FIG. 3A where the source graph is depicted as a factor graph, according to one embodiment.

With reference to FIGS. 3A and 3B, in one embodiment, $u \triangleq \mathcal{G}' \cup u = (S, \Psi \cup X, \epsilon' \cup F)$ represents a combined source-code graph 300 in factor graph form. In the graph 300, the source nodes S are shared between the source subgraph 302a and code subgraph 304. In the embodiment depicted in FIG. 3A, the source model is described as a pairwise model in the subgraph 302a. In this subgraph, $\Psi$ is elided. In general, however, either or both of source and code subgraphs can be factor graphs (also called Tanner graphs). For example, FIG. 3B shows a same source model as a source factor graph 302b. A source graph can also be a directed or undirected PGM. The source nodes divide $u$ into a source side and a code side. The decoder 204 (shown in FIG. 2) performs belief propagation (BP) on the combined graph 300, representing approximate marginalization on the joint objective:

$$u(s^n) \triangleq c(s^n) p_{s^n}(s^n)$$

In BP, each node in a graph corresponds to a local computation device accepting inputs and emitting outputs on edges, to connected ports. For a graph $\mathcal{G}=(\mathcal{S},\epsilon)$ represented as bipartite factor graph $\mathcal{F}=(\mathcal{S},\Psi,\epsilon')$, $\mathcal{S}$ may be called variable nodes and $\Psi$ may be called factor nodes. In this representation, each factor node corresponds to one unfactorizable clique $c$ of $\mathcal{G}$. $\epsilon'=\{(\psi c, s_i):\psi c \in \Psi, s_i \in c\}$ represents the edges between factor nodes and their corresponding clique variable nodes.

In general, any function $f(s_1, \ldots, s_l)$ over l variables, $f: \mathcal{S}^l \to R$, can be represented by a tensor $$f_{i_1,\ldots,i_{l'}}^{i_{l'+1},\ldots,i_l}$$

of total order l. In general, $f$ represents a factor in a graph, with l edges to l variable nodes. Thus, $f$ is a function over l variable nodes and, graphically, there are l edges to $f$ and, correspondingly, there are l ports. Some of the l (e.g., l') ports are designated as input ports and the rest (e.g., l-l') ports are designated as output ports. For example, in decoding, in some embodiments, l-1 ports are designated as inputs, that emit one output. Such a function (also called tensor) can be implemented as a machine with the numbers of input and output ports summing to l. For the special case of a (1; 0)-tensor $m^i$, representing a unary function $m: \mathcal{S} \to R$, the unitary function is called a message. Two atomic operations, namely, accumulation and filtration, are associated with messages. The accumulation operation on a set of messages $\mathcal{M}$, is described as $\mathcal{M}:\circ_{m\in\mathcal{M}} m$ where $\circ$ is the Hadamard product. The filtration operation by a factor $\psi$: $\mathcal{S}^l \to R$ on a set of messages $\mathcal{M}$ is described as $\mathcal{M}:\psi(\bigotimes_{m\in\mathcal{M}} m)$, where $\bigotimes$ is the tensor product, and the outermost operation is a tensor contraction. $\psi$ and $f$ represent factors in the source graph (represented as a factor graph) and code graph (represented as another factor graph), respectively.

For convenience, in some embodiments, input or output ports of a node are labeled by the adjacent node to which these ports are connected in $\mathcal{F}$. A variable-node output message of the node $s_i$, on the port $\psi c$, is denoted as $m^{i \to} c(s_i)$. A factor-node output message of the node $\psi c$, on the port $s_i$, is denoted as $m^{i \to} c(s_i)$. Thus, two directional messages are associated with each edge of $\epsilon'$. Reciprocally, $m^{i \to} c(s_i)$ and $m^{i \leftarrow} c(s_i)$ represent a factor-node input message and a variable-node input message, respectively.

Referring again to FIGS. 3A-3C, for each source node $s_i$ form $\mathcal{S}$ in the source-code graph 300, there are two sets of neighbor nodes, one on source side and one on code side. Only the source nodes interact with both sides. The factor nodes only interact with nodes in its own corresponding subgraph. In the combined BP, messages are passed along all edges, and computations are performed on the three sets of nodes, $\mathcal{S}$, $\Psi$, and $\mathcal{X}$.

First, messages are computed as described below for the nodes that do not interact with another side directly. In these computations, $\mu$ indicates source-side messages and m indicates code-side messages; wildcards, i.e., all nodes, only expand within the subgraph of their message. In $\Psi$ node output computation, for every output port $s_i$ of $\psi c$, filter messages on ports not $s_i$ by $\Psi c$ using:

$$\mu^{i \leftarrow c} \Leftarrow \psi_{\sim i}^i \mu^{\sim i \to c}$$

Figure 3C:
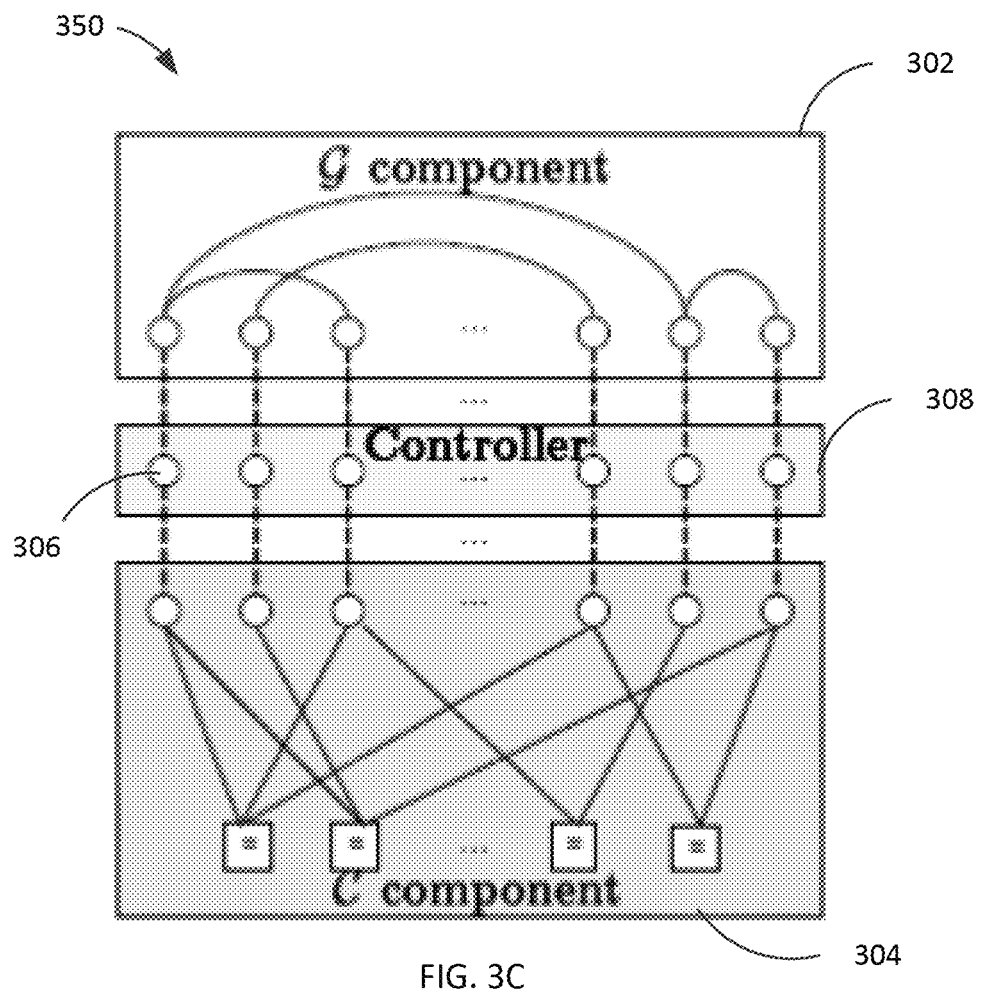
FIG. 3C schematically depicts a particular implementation of the decoder depicted in FIGS. 3A and 3B, according to one embodiment.
Figure 3D:
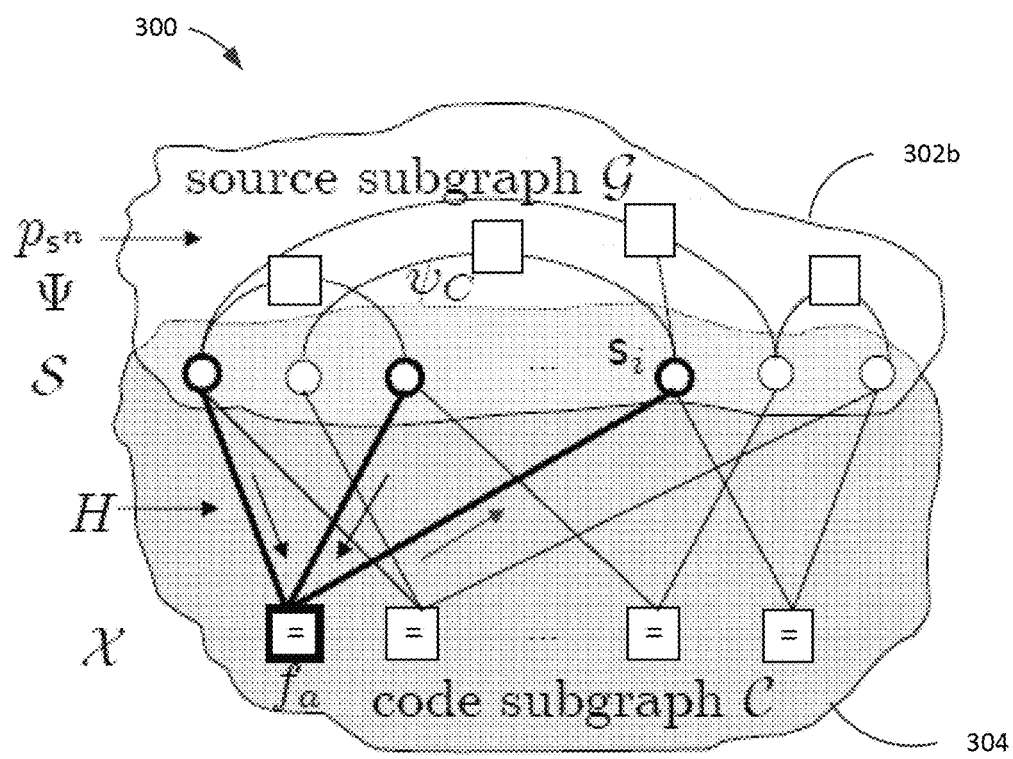
FIGS. 3D-3G schematically depict message passing in the decoder depicted in FIG. 3B, according to various embodiments.
Figure 3E:
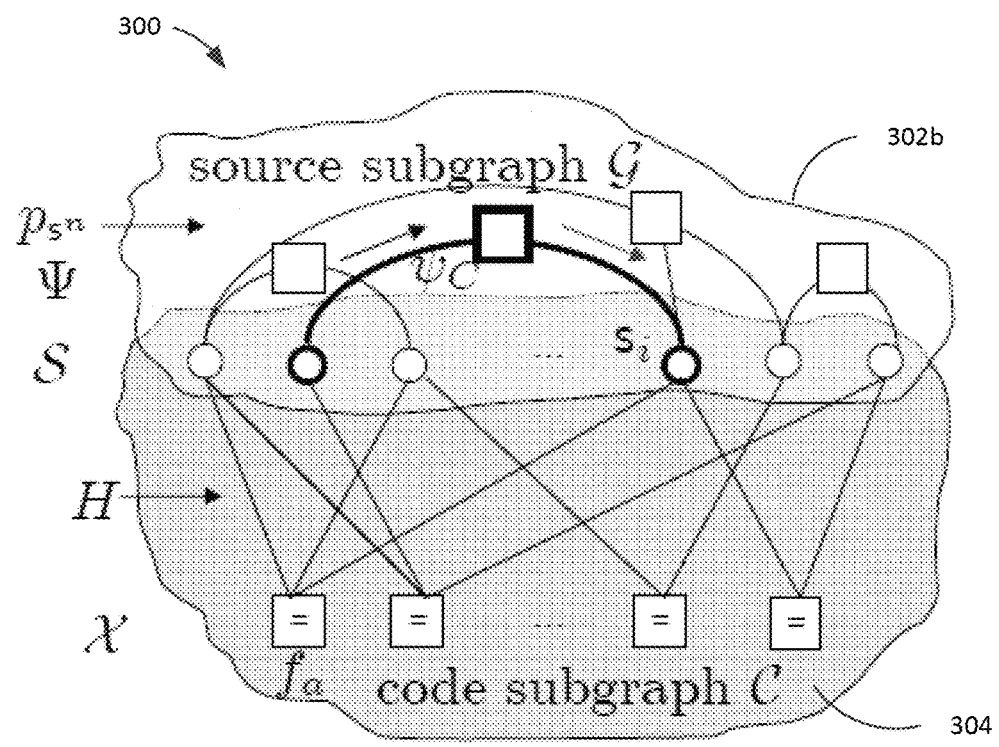

In general, $\mu^{\sim i \to} c$ represents information received at $\Psi c$ corresponding to $S_i$ from all source nodes except $S_i$, as depicted in FIG. 3D. In $\mathcal{X}$ node output computation, for every output port $S_i$ of $f_a$, filter messages on ports not $S_i$ by $f_a$, as depicted in FIG. 3E, using:

$$m^{i \leftarrow a} \Leftarrow f_{\sim i}^i m^{\sim i \to a}$$

Next, messages for nodes that open ports to both sides of the joint graph are computed as source side and code side output computations. Specifically, in source side s-node output computation, for every output port $\Psi c$ of $S_i$, messages on ports not $\Psi c$ are accumulated as:

$$\mu^{i \to c} \Leftarrow \mu^{i \leftarrow \sim c}[m^{i \leftarrow *}]$$

In code side s-node output computation, for every output port $f_a$ of $S_i$, messages on ports not $f_a$ are accumulated as:

$$m^{i \to a} \Leftarrow m^{i \leftarrow \sim a}[\mu^{i \leftarrow *}]$$

Figure 3F:
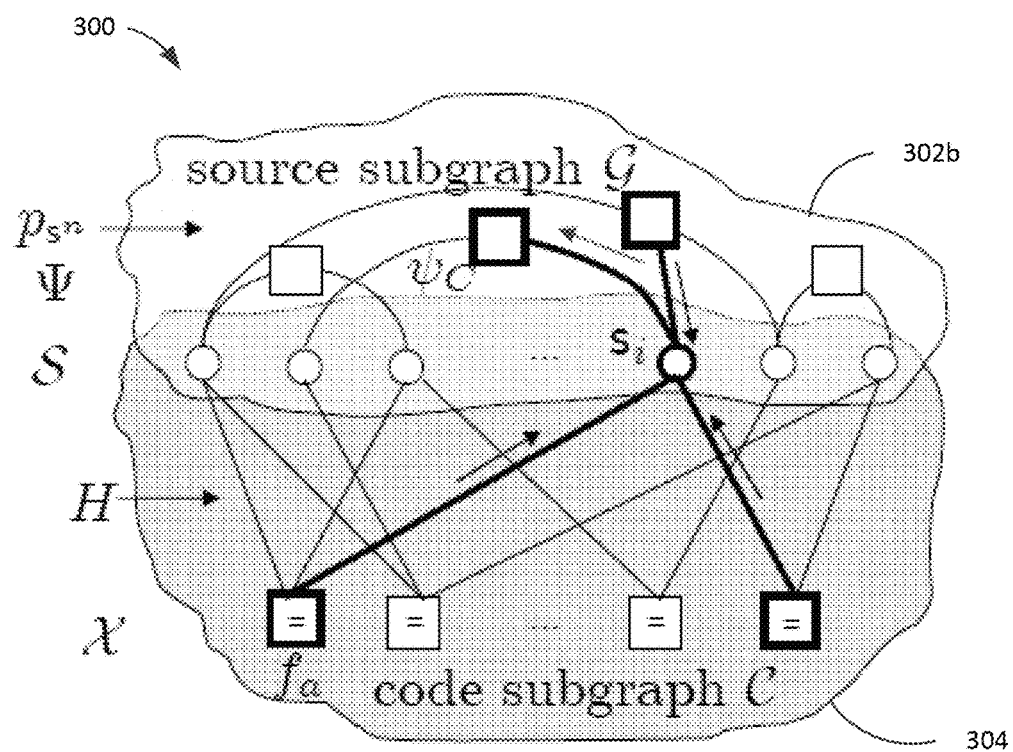
Figure 3G:
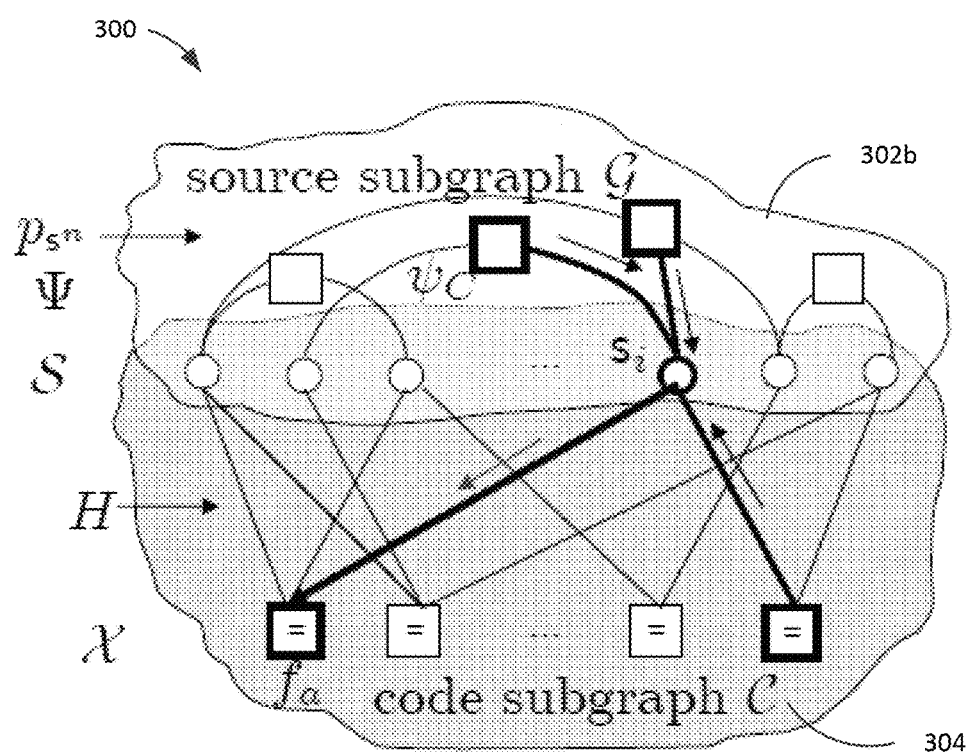

$\mu^{i \leftarrow \sim c}$ is the aggregation of messages received at $S_i$ from all other factor nodes except $\Psi c$, and $[m^{i \leftarrow *}]$ is the aggregate of the code-side messages, as depicted in FIG. 3F. Similarly, $m^{i \leftarrow \sim a}$ is the aggregation of messages received at $S_i$ from all factor nodes except $f_a$, and $[\mu^{i \leftarrow *}]$ is the aggregate of all source-side messages, as depicted in FIG. 3G.

Finally, referring back to FIGS. 3D and 3E, total belief computation is performed for every $S_i$ by accumulating messages on all ports as;

$$b^i = [\mu^{i \leftarrow *}][m^{i \leftarrow *}]$$

The computations associated with the subgraphs 302a, 302b, 304 and with overall source-code graph 300 may be implemented by one or more hardware processors and/or as one or more software components. In one embodiment, each node of these graphs can execute the associated accumulation and filtration operations atomically, using a processor dedicated to that node. In other embodiments, one processor (implemented as a hardware and/or software processor) may perform computations associated with only some of the nodes, the operations associated with the other nodes being performed by additional hardware and/or software processors.

The bracketed terms, despite being Hadamard products of many messages, may be understood as single lumped messages that do not change with respect to the port on which the output is emitted. Therefore, in some embodiments, when a node of $\mathcal{S}$ is emitting on one subgraph, the lumped message from the other subgraph can be pre-computed and considered to be an external message on a virtual port opened on the side of that subgraph. As such, BP on $u$ is the same as BP on each subgraph alone (e.g., subgraphs 302a, 302b, 304 in FIGS. 3A and 3B), with the addition of an external I/O port and computation to determine the external message. Taking advantage of this property, in some embodiments, a decoder system 350 depicted in FIG. 3C is architecturally modular, with external messages and virtual ports 306 acting as the only interface between graph-inferential components 302a, 302b, 304.

In general, while each component can compute a total belief using external messages, referring again to FIG. 3C, in some embodiments, a main controller 308 is used to handle component-agnostic operations. The controller 308 is simply another component over the port-preserving "intersection" subgraph $\mathcal{A} \triangleq \mathcal{G}' \cap * c = (\mathcal{S}, \emptyset, \epsilon' \cup \mathcal{F})$. All of the ports of this subgraph can be interpreted as virtual ports, i.e., the ports 306, that can receive external messages. Therefore, for the controller 308, BP from which the original uncompressed data sequence may be derived can be expressed as $$\text{Total belief computation: } b^i = [M^{i \leftarrow *}]$$

where the wildcard is taken over all virtual ports 306. The computations for the pairwise model depicted in FIG. 3C are shown in FIG. 4.

To perform the various computations described above according to a parallel schedule, each component (e.g., subgraphs 302a, 302b, 304 depicted in FIGS. 3A-3C), may compute internal messages and may then exchange external messages with each other simultaneously. As used herein, a simultaneous exchange of two messages does not require the start and/or end of two exchanges to coincide. The exchange is considered to be simultaneous if the two exchanges overlap, i.e., at least a part of one exchange occurs while at least a part of the other exchange is in progress. In a serial schedule, one component is active at a time, and presents its latest external messages to another component. A serial schedule may alternate between source message passing and code message passing. Within a component, the computations may be executed in parallel, whether or not the exchange of external messages occurs in parallel or serially.

Referring back to FIGS. 2 and 7, in the decoder 204, belief propagation is typically performed until convergence or declaration of failure is determined. The expression $\hat{p}_{s_i} = b^i / \|b^i\|_1$ can be used to determine convergence and, if a convergence is detected, the decompressed output of the decoder 204 may be expressed as:

$$\hat{s}_i = \underset{s_i}{\arg\max}\, \hat{p}_{s_i}(s_i)$$

Some data models associated with a data sequence to be uncompressed may not be known fully. Parametric models represent one type of such partially specified models. If an uncompressed data sequence s is drawn from a distribution p(s; θ) where θ denotes unknown parameters, a checksum-correctness objective may be defined as:

$$F(\hat{s}) = \frac{1}{k}\|H\hat{s} - x\|$$

where $\|\cdot\|$ is some appropriate norm (e.g., $l_0$). At each iteration t of the decoding process described with reference to FIGS. 3A-3C, F(•) is evaluated on the contemporary source estimate $\hat{s}^{(t)}(\theta)$ obtained from the total belief update. The value θ* that minimizes $F(\hat{s}^{(t)}(\theta))$ among choices in a neighborhood $\mathcal{B}_{\delta^{(t)}}(\theta^{(t-1)})$, for some diminishing sequence $\delta^{(1)} > \delta^{(2)} > \ldots > 0$ of bounded sum (e.g., $\delta^{(t)} = \delta/\alpha^t$ for $\delta > 0$, $\alpha > 1$)), is chosen as the parameter estimate for that iteration. At the end of decoding, the sequence of estimates for θ are also converged within some neighborhood, to determine the parameters of the partially specified model. During the iterations, the model is revised using the estimated parameters.

In some embodiments, the source model used in decoding is augmented with parameter nodes. To this end, while θ is deterministic, a Bayesian belief $p_\Theta(\theta)$ can be constructed to represent θ. $p_\Theta(\theta)$ may be unknown, but the true θ can be drawn from a random variable $\theta \sim p_\Theta$. Therefore, in some embodiments, the joint distribution $(s^n, \theta)$ $(s^n, \theta)$ is written as:

$$p_{S^n\Theta}(s^n, \theta) = p_\Theta(\theta) \prod_{i=1}^{n} p_{S_i|\Theta}(s_i | \theta)$$

In the graph a $\mathcal{G}$ for the source $s_n$, the nodes $\mathcal{S} = \{s_1, \ldots, s_n\}$ may be augmented by a node θ, connected to all other nodes of $\mathcal{G}$ via $\pi(s_i, \theta)$ as edge potential as replacement for node potential $\phi(s_i)$, to obtain an augmented graphical model. Using this augmented model, the decoder can decode/uncompress a compressed data sequence using the objective:

$$u(s^n, \theta) \stackrel{\Delta}{=} c(s^n) p_{S^n\Theta}(s^n, \theta)$$

In various embodiments described herein, the source s (i.e., data to be compressed) and the code as represented by H are based on a field S=GF(q). If q=2, the source and the code are binary; otherwise, the source and the code are based on a non-binary alphabet. Such non-binary sources may have substantial complexity in their internal symbol structure, and source models are defined over those symbols. Consider, for example, floating point numbers or relational database entries as source symbols. In real systems, even though source s may be highly structured internally, s is often presented to the compression system after the source s has already been serialized into an opaque bit-stream z. In model-free encoding, it is therefore not realistic to assume the actual field structure or even the alphabet size of s, at the encoder.

In order to be able to use binary LDPC codes in compression/decompression of non-binary data i.e., H is GF(2) but s is GF(M), M>2, or in general, to use a code over a different alphabet than the source alphabet, a source with an alphabet larger than GF(2) may be modified by bit-planing, i.e., by treating the bits representing a letter in a larger alphabet as independent GF(2) sources. Bit-planing, however, may not achieve the best results in terms of compression efficiency.

Figure 5:
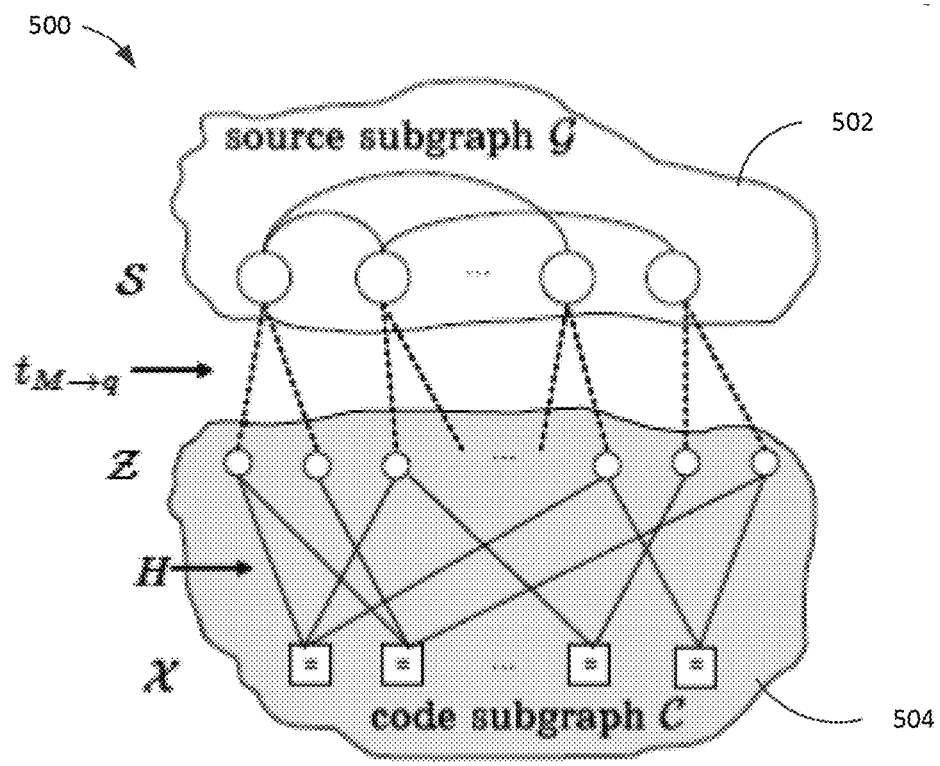
FIG. 5 schematically depicts a decoder for uncompressing a compressed data sequence derived from a non-binary source, according to one embodiment.

With reference to FIGS. 5 and 8, in one embodiment, a data sequence $s^n = \{s_1, \ldots, s_n\}$ is an n-symbol data sequence that, instead of bit-planing, is serialized by symbol level representational maps. In this embodiment, all $s_i$ i.e., $\mathcal{S}$, belong to the same alphabet S of size M and, as such, there is one map for all n symbols, though in some situations, different symbols may belong to alphabets of different sizes. The representation map is a bijective function $t_{M \to q}: S \to GF(q)^\mathcal{B}$ where $\mathcal{B} \geq \log_q M$. For integer symbols $s_i$ serialized into GF(2), the mapping can be a computer representation of the integers, or other binary expansions such as Gray-coding. When messages are passed to or from source nodes, there are related messages on the serialized representations of the source nodes. As such, a pair of message translation functions that convert between a message $m^{(M)}$ over $S$ and a $\mathcal{B}$-tuple of messages $m^{(q)} = m_1^{(q)}, \ldots, m_{\mathcal{B}}^{(q)}$ over $GF(q)$ can be defined as:

$$T_{M \to q}: (S \to R^+) \to (GF(q) \to R^+)^{\mathcal{B}}$$

$$T_{q \to M}: (GF(q) \to R^+)^{\mathcal{B}} \to (S \to R^+)$$

In some embodiments, assuming message are properly normalized probabilities, for $\omega \in \{1, \ldots, \mathcal{B}\}$ and $\beta \in GF(q)$ $$T_{M \to q}(m^{(M)})_\omega(\beta) = \sum_{\alpha \in S} m^{(M)}(\alpha) 1\{t_{M \to q}(\alpha)_\omega = \beta\}$$

and for $\alpha \in S$, $$T_{q \to M}(m^{(q)})(\alpha) = \prod_{\omega=1}^{B} m_\omega^{(q)}(t_{M \to q}(\alpha)_\omega)$$

During decoding, passing messages to or from source nodes $S$ corresponds to passing related messages on the serialized representations of the source nodes.

In this embodiment, encoding of the source sequence $s^n$ takes place in the representational domain of bit-streams, i.e., in a code domain. Given an LDPC projection matrix $H \in GF(q)^{k \times nB}$ and rate $r_{code} = k/nB$, the compressed output is:

$$x^k = Hz^{nB} = Ht_{M \to q}(s^n)$$

For an uncompressed data sequence $\mathcal{S} = \{s_1, \ldots, s_n\}$ expressed in a graphical decoder, the serialized symbols $Z$ via the representative map $t_{M \to q}$ can be expressed as:

$$\{z_{i,1}, z_{i,2}, \ldots, z_{i,B}\} \equiv t_{M \to q}(s_i)$$

$$\mathcal{Z} \equiv t_{M \to q}(S) = \bigcup_{s \in S} t_{M \to q}(s)$$

Without the representative map, the code subgraph and the source subgraph share the n source nodes in the source-code graph, as discussed above with reference to FIG. 3A. With the representative map, however, that is no longer the case. Instead, for $\mathcal{G} = (\mathcal{S}, \epsilon)$ represented as a factor graph $\mathcal{G}' = (\mathcal{S}, \Psi, \epsilon')$, $c = (\mathcal{S}, \mathcal{X}, \mathcal{F})$ where $\mathcal{Z} = t_{M \to q}(\mathcal{S})$). The corresponding combined source-code graph 500 is $u \triangleq (\mathcal{S} \cup \mathcal{Z}, \Psi \cup \mathcal{X}, \epsilon' \cup \mathcal{F})$. The message passing strictly within each subgraph, i.e., source subgraph 502 and code subgraph 504 is similar to that described with reference to FIG. 3A. When messages cross alphabet/representation boundaries, and are passed from one subgraph to another, however, the messages are translated according to $t_{M \to q}$. The corresponding decoding can be called generalized decoding. In various embodiments, the source (i.e., data to be compressed) and messages are translated into a binary format using a mapping $t_{M \to 2}$.

Sometimes privacy of the data to be compressed and/or transmitted must be retained. Therefore, in some instances, a version of the data that has already been encrypted, e.g., by adding a secret key to a bit-stream representation of the data, is presented to the compressor (e.g., the encoder 202 shown in FIG. 2). Thus, as discussed above in describing non-binary sources, the compressor/encoder receives $t_{M \to 2}(s) \oplus k$ where $k = \{k_1, \ldots, k_{nB}\}$ are nB bits of key associated with the nB bits representing the unencrypted data s. This stream is largely uncompressible using conventional encoders, without the encoder also having the key. Various embodiments of model-free encoders described herein, however, can consider $\oplus k$ as part of a representational map and may apply coding to $t_{M \to 2}(s) \oplus k \equiv t'_{M \to 2}(s)$. The bijective function $t_{M \to q}$, where q=2, and the corresponding message translation functions $T_{M \to q}$ and $T_{q \to M}$, for q=2, can be obtained as described above.

Figure 6:
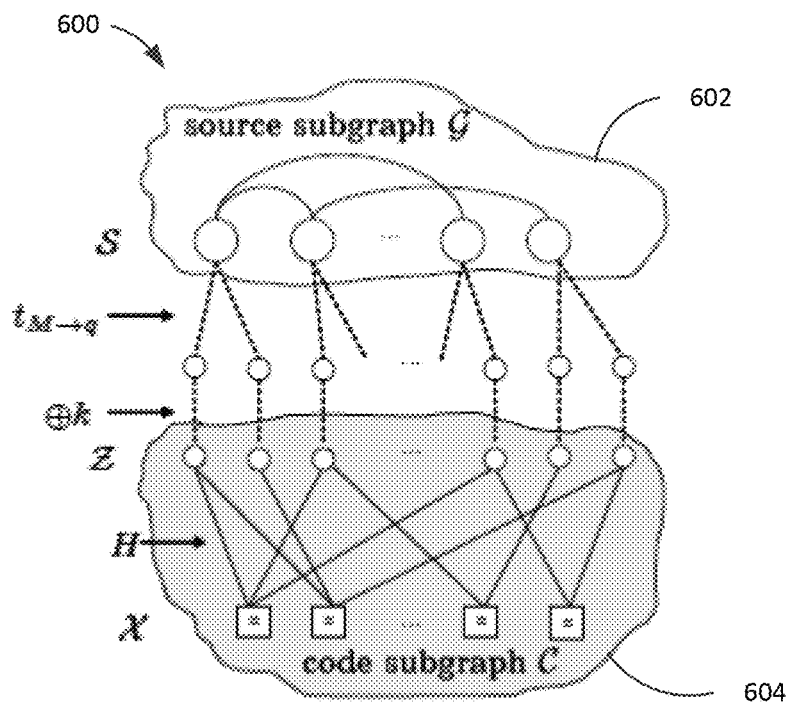
FIG. 6 schematically depicts a decoder for uncompressing a compressed encrypted data sequence, according to one embodiment.

With reference to FIG. 6, while decoding $u$, represented as a source-code graph 600, the source subgraph 602 is unencrypted because s, the object of decoding, is unencrypted. The code subgraph 604, however, is encrypted because $z = t_{M \to 2}(s) \oplus k$ is encrypted and x=Hz is also encrypted. The encryption boundary thus coincides with the representation boundary. As such, in one embodiment, a decoder applies generalized decoding, using $t'_{M \to 2}$ and the corresponding $T'_{M \to 2}$ and $T'_{2 \to M}$ pair. During each iteration of this decoder, $m \mathcal{G}_{\to i}^{(M)}(s_i)$ is obtained by message decryption followed by the translation $T_{2 \to M}$, and decoding $m \mathcal{G}_{\to i,\omega}^{(q)}(z_{i,\omega})$ is performed by the translation $T_{M \to 2}$ followed by message encryption.

In some situations, lossless compression is infeasible or is impractical and, hence, the data sequence must be compressed using a lossy compression technique. Lossy compression may be preferred over lossless compression, even when the latter is feasible, for performance and/or cost benefits. Lossy compression involves two sources of compression gain: (1) conflating multiple source sequences as one (i.e., quantization), and (2) exploiting the data model (i.e., entropy-based compression). These two sources of compression gain relate, respectively, to two sources of prior knowledge, namely: (1) a distortion measure and/or semantic information, and (2) the data model. In various embodiments, the encoder is aware of the quantization, i.e., the distortion measure and/or semantic information but, as described with reference to FIG. 2, the compression is performed without relying on any significant information related to the data model. The quantization is also performed without relying on any significant information about the data model. As such, in some embodiments, the encoder includes a model-free quantization stage followed by a model-free coding stage. The corresponding decoder may use a model of the quantization together with the code subgraph, and the source subgraph.

The design of a compression system for each data type, as the known systems generally require, can be a costly and time consuming process, spanning years of development. As technology improves, it is valuable to be able to take incremental advantage without full system overhaul. In various embodiments, compression with model-free encoding generates an open-ended compressed stream that is not tied to a particular source model, so that almost any change to this key piece of information can be made at the decoder as one sees fit. The described systems and methods thus present a low barrier not only to improvements but also to the initial design, so that a crude decoder can be made for many types of emerging data, with the goal of subsequent modification without fear of losing compatibility.

Sometimes the source model is not fully known at the encoder, for example, if the bit representation of the data is unknown or it is encrypted data, or if it would help to encode without incorporating certain complex source structure for data retrieval reasons. In these cases, the technology described herein still allows efficient compression as if this information were known at the encoder, but allows these tasks to actually be deferred to the decoder. Ensuring end-to-end performance is also important when compressed data is transported across an unreliable network, such as WiFi or cellular networks, or over complex distributed network topologies. Traditionally, the compression and error correction designs are jointly designed to some degree to ensure best performance under such circumstances because the compressed output has intricate structure with critical and uncritical parts relating to the data type. In various embodiments, compression with model-free encoding and model-based decoding creates a compressed information stream in which the parts of the stream are interchangeable so that network-specific issues can be left to the transport layer, and no particularly special compression system needs to be designed for distributed/P2P streaming or different networks characteristics.

In recent years, the computing landscape has moved towards a model of low-power mobile acquisition devices and powerful processing nodes at the server. This means the existing methods of compression, where a sophisticated encoder takes into account all source model information and a simple decoder reproduces the data, may not utilize resources in the right way. The described technology, with the model-free or model-independent encoder and a relatively more complex, model-based decoder, is well suited for this new landscape. It also allows the tradeoff of compression efficiency (hence network load) and computational load at the decoder to be dynamically adjusted, by choosing to use a crude or sophisticated source model, something that is very difficult if not impossible to achieve using known compression techniques.

Applications for, and advantages of, the model-free encoding and model-based decoding technique for compression and decompression include compressing data stores of new and existing data types, improved end-to-end performance for stored and streaming network applications, more privacy and content protection at upstream sites, and many others.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language resource), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending resources to and receiving resources from a device that is used by the user; for example, by sending web pages to a web browser on a user's client device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A computer implemented method of decompressing a compressed data sequence comprising a set of k symbols and being devoid of a significant portion of a source model associated with a data sequence from which the compressed data sequence was derived, the method comprising:
   generating by a processor an uncompressed data sequence comprising n symbols, wherein n is greater than k, by applying by the processor to the set of k symbols of the compressed data sequence:
   a plurality of constraints devoid of a significant portion of the source model; and
   at least one rule derived from the source model.

2. The method of claim 1, wherein the compressed data sequence was derived from the uncompressed data sequence by applying the plurality of constraints to the uncompressed data sequence.

3. The method of claim 2, wherein:
   the uncompressed data sequence comprises an encrypted data sequence;
   derivation of the compressed data sequence was performed without any information about any encryption key used in generating the encrypted data sequence; and
   the processor uses an encryption key used in generating the encrypted data sequence for generating the uncompressed data sequence.

4. The method of claim 1, wherein the plurality of constraints comprises at least one of a projection matrix corresponding to a low density parity check (LDPC) code; a linear code; a code on a graph comprising at least one of an LDPC code, a turbo code, a repeat-accumulate code, a convolutional code, and a trellis code; and a polar code.

5. The method of claim 1, wherein each constraint of the plurality of constraints is independent of any rule derived from the source model.

6. The method of claim 1, wherein generating the uncompressed data sequence comprises:
   (a) applying by the processor to at least one of the k symbols at least one constraint from the plurality of constraints, to obtain at least one intermediate result; and (b) applying by the processor the at least one rule to the at least one intermediate result.

7. The method of claim 6, wherein at least one of steps (a) and (b) is repeated at least once.

8. The method of claim 7, wherein, in one iteration, step (b) is performed before step (a).

9. The method of claim 1, wherein generating the uncompressed data sequence comprises:
   (i) applying by the processor to at least one of the k symbols at least one rule, to obtain at least one intermediate result; and
   (ii) applying by the processor at least one constraint from the plurality of constraints to the at least one intermediate result.

10. The method of claim 9, wherein at least one of steps (i) and (ii) is repeated at least once.

11. The method of claim 10, wherein, in one iteration, step (ii) is performed before step (i).

12. The method of claim 1, wherein:
   the source model is partially unknown and is parameterized; and
   generating the uncompressed data sequence comprises iteratively applying the plurality of constraints and at least one rule, and iteratively refining at least one parameter of the source model.

13. The method of claim 1, wherein the source model is represented as at least one of a graph, a codebook, an enumeration, a list of examples, a list of features, an algorithm, and a data structure.

14. The method of claim 1, wherein the source model is partially unknown and is parameterized, the method further comprising:
   representing the source model as a graph; and
   augmenting the graph using one or more parameters of the source model.

15. The method of claim 1, wherein generating the uncompressed data sequence comprises representing the n symbols of the uncompressed data sequence in a binary form.

16. The method of claim 1, wherein:
   the compressed data sequence is completely devoid of the source model; and
   the plurality of constraints are completely devoid of the source model.

17. The method of claim 1, further comprising applying by the processor to the set of k symbols of the compressed data sequence another plurality of constraints representing a quantization of the set of n symbols according to at least one of a distortion measure and semantic information.

18. A computer implemented method of compressing a data sequence comprising a set of n symbols, the method comprising:
   receiving by a processor a data sequence comprising a set of n symbols and corresponding to a source model; and
   mapping by the processor the set of n symbols into a set of k symbols, wherein k is less than n, the mapping being independent of the source model and being performed without extracting the source model from the data sequence.

19. The method of claim 18, wherein the set of k symbols is devoid of a significant portion of the source model.

20. The method of claim 18, wherein the mapping comprises applying to the data sequence at least one of a projection matrix corresponding to a low density parity check (LDPC) code; a linear code; a code on a graph comprising at least one of an LDPC code, a turbo code, a repeat-accumulate code, a convolutional code, and a trellis code; and a polar code.

21. The method of claim 18, wherein:
   the data sequence comprises an encrypted data sequence; and
   the mapping is performed without any information about any encryption key used in generating the encrypted data sequence.

22. The method of claim 18, further comprising quantizing the set of n symbols according to at least one of a distortion measure and semantic information, prior to the mapping.

23. The method of claim 18, wherein the source model is represented as at least one of a graph, a codebook, an enumeration, a list of examples, a list of features, an algorithm, and a data structure.

24. A system for decompressing a compressed data sequence comprising a set of k symbols and being devoid of a significant portion of a source model associated with a data sequence from which the compressed data sequence was derived, the system comprising:
   a first processor; and
   a first memory in electrical communication with the first processor, the first memory comprising instructions which, when executed by a processing unit comprising at least one of the first processor and a second processor, program the processing unit to:
   generate, from the compressed data sequence, an uncompressed data sequence comprising n symbols, where n is greater than k, by applying to the set of k symbols of the compressed data sequence:
      a plurality of constraints devoid of a significant portion of the source model; and
      at least one rule derived from the source model.

25. The system of claim 24, wherein generation of the uncompressed data sequence comprises at least one of an accumulation operation and a filtration operation, and the processing unit is configured to provide atomically at least one of the accumulation operation and the filtration operation.

26. The system of claim 24, wherein:
   the compressed data sequence is completely devoid of the source model; and
   the plurality of constraints are completely devoid of the source model.

27. A system for compressing a data sequence comprising a set of n symbols, the system comprising:
   a first processor; and
   a first memory in electrical communication with the first processor, the first memory comprising instructions which, when executed by a processing unit comprising at least one of the first processor and a second processor, program the processing unit to:
   map the set of n symbols into a set of k symbols, where k is less than n, the mapping being independent of a source model corresponding to the data sequence and being performed without extracting the source model from the data sequence.

* * * * *